(12) United States Patent
Bailey et al.

(10) Patent No.: US 11,621,025 B1
(45) Date of Patent: Apr. 4, 2023

(54) MAP CREATION FROM HYBRID DATA

(71) Applicant: UATC, LLC, San Francisco, CA (US)

(72) Inventors: Gordon Peter Bailey, Pittsburgh, PA (US); Bryan John Nagy, Allison Park, PA (US); Adam Henry Polk Milstein, Pittsburgh, PA (US); Robert Zlot, Pittsburgh, PA (US); Adam Panzica, Pittsburgh, PA (US); Brett Bavar, Pittsburgh, PA (US); David Prasser, Pittsburgh, PA (US); Peter Hansen, Pittsburgh, PA (US); Ethan Duff Eade, Pittsburgh, PA (US); Xxx Xinjilefu, Pittsburgh, PA (US); Brett Browning, Pittsburgh, PA (US)

(73) Assignee: UATC, LLC, San Francisco, CA (US)

( * ) Notice: Subject to any disclaimer, the term of this patent is extended or adjusted under 35 U.S.C. 154(b) by 91 days.

(21) Appl. No.: 17/305,275

(22) Filed: Jul. 2, 2021

Related U.S. Application Data

(63) Continuation of application No. 15/903,999, filed on Feb. 23, 2018, now Pat. No. 10,403,346.

(Continued)

(51) Int. Cl.
*G11C 7/04* (2006.01)
*G11C 11/16* (2006.01)
*G11C 13/00* (2006.01)
*G05F 1/56* (2006.01)
*G11C 5/14* (2006.01)
(Continued)

(52) U.S. Cl.
CPC .......... *G11C 11/1673* (2013.01); *G05F 1/56* (2013.01); *G11C 5/147* (2013.01); *G11C 7/04* (2013.01);
(Continued)

(58) Field of Classification Search
CPC ....... G11C 11/1673; G11C 5/147; G11C 7/04; G11C 7/12; G11C 11/1697;
(Continued)

(56) References Cited

U.S. PATENT DOCUMENTS

| 9,775,004 B2 | 9/2017 | Cawse et al. |
| 2005/0015203 A1 | 1/2005 | Nishira |

(Continued)

OTHER PUBLICATIONS

"U.S. Appl. No. 15/903,399, Examiner Interview Summary dated Feb. 22, 2021", 2 pgs.

(Continued)

*Primary Examiner* — Xiaochun L Chen
(74) *Attorney, Agent, or Firm* — Schwegman Lundberg & Woessner, P.A.

(57) ABSTRACT

A method for receiving autonomous vehicle (AV) map data associated with an AV map of a geographic location and coverage map data associated with a coverage map of the geographic location. The AV map data is associated with an AV lane of a roadway in the geographic location, and the coverage map data is associated with a coverage lane of the roadway in the geographic location. The method includes generating a hybrid map of the geographic location based on the AV map data and the coverage map data and providing hybrid map data associated with the hybrid map for routing of an AV. The hybrid map includes the AV lane linked with the coverage lane of the roadway.

20 Claims, 11 Drawing Sheets

Related U.S. Application Data

(60) Provisional application No. 62/582,731, filed on Nov. 7, 2017.

(51) Int. Cl.
    *G11C 7/12*     (2006.01)
    *G11C 11/4076*   (2006.01)
    *G11C 11/4094*   (2006.01)

(52) U.S. Cl.
    CPC ............ *G11C 7/12* (2013.01); *G11C 11/1697* (2013.01); *G11C 11/4076* (2013.01); *G11C 11/4094* (2013.01); *G11C 13/004* (2013.01); *G11C 13/0038* (2013.01); *G11C 2013/0054* (2013.01); *G11C 2207/002* (2013.01)

(58) Field of Classification Search
    CPC ............ G11C 11/4076; G11C 11/4094; G11C 13/0038; G11C 13/004; G11C 2013/0054; G11C 2207/002; G05F 1/56
    See application file for complete search history.

(56) References Cited

U.S. PATENT DOCUMENTS

| | | |
|---|---|---|
| 2010/0161192 A1 | 6/2010 | Nara et al. |
| 2014/0156182 A1 | 6/2014 | Nemec et al. |
| 2017/0018189 A1 | 1/2017 | Ishikawa |
| 2018/0003511 A1* | 1/2018 | Browning .......... G01C 21/3819 |
| 2018/0329414 A1 | 11/2018 | Igarashi et al. |
| 2018/0354518 A1 | 12/2018 | Inou et al. |
| 2019/0071099 A1 | 3/2019 | Nishiguchi |
| 2019/0084572 A1 | 3/2019 | Oishi et al. |
| 2019/0137285 A1 | 5/2019 | Bailey et al. |

OTHER PUBLICATIONS

"U.S. Appl. No. 15/903,399, Final Office Action dated Dec. 3, 2020", 9 pgs.

"U.S. Appl. No. 15/903,399, Non Final Office Action dated Jul. 10, 2020", 9 pgs.

"U.S. Appl. No. 15/903,399, Notice of Allowance dated Mar. 22, 2021", 6 pgs.

"U.S. Appl. No. 15/903,399, Response filed Mar. 3, 2021 to Final Office Action dated Dec. 3, 2020", 12 pgs.

"U.S. Appl. No. 15/903,399, Response filed Jun. 8, 2020 to Restriction Requirement dated Apr. 7, 2020", 9 pgs.

"U.S. Appl. No. 15/903,399, Response filed Oct. 9, 2020 to Non Final Office Action dated Jul. 10, 2020", 12 pgs.

"U.S. Appl. No. 15/903,399, Restriction Requirement dated Apr. 7, 2020", 6 pgs.

* cited by examiner

MAP CREATION FROM HYBRID DATA

CROSS REFERENCE TO RELATED APPLICATION

This application is a continuation of and claims the benefit of priority of U.S. application Ser. No. 15/903,399, filed Feb. 23, 2018, which claims the benefit of priority of U.S. Provisional Application No. 62/582,731, filed Nov. 7, 2017, the entire contents of which are hereby incorporated by reference in their entireties.

BACKGROUND

An autonomous vehicle (AV) (e.g., a driverless car, a driverless auto, a self-driving car, a robotic car, etc.) is a vehicle that is capable of sensing an environment of the vehicle and traveling (e.g., navigating, moving, etc.) in the environment without human input. An AV uses a variety of techniques to detect the environment of the AV, such as radar, laser light, Global Positioning System (GPS), odometry, and/or computer vision. In some instances, an AV uses a control system to interpret information received from one or more sensors, to identify a route for traveling, to identify an obstacle in a route, and to identify relevant traffic signs associated with a route.

SUMMARY

According to some non-limiting embodiments or aspects, provided is a method including: receiving, with a computer system including one or more processors, autonomous vehicle (AV) map data associated with an AV map of a geographic location, wherein the AV map data is associated with an AV lane of a roadway in the geographic location; receiving, with the computer system, coverage map data associated with a coverage map of the geographic location, wherein the coverage map data is associated with a coverage lane of the roadway in the geographic location; generating, with the computer system, a hybrid map of the geographic location based on the AV map data and the coverage map data, wherein the hybrid map includes the AV lane linked with the coverage lane of the roadway; and providing, with the computer system, hybrid map data associated with the hybrid map for routing of an AV.

In some non-limiting embodiments or aspects, generating the hybrid map includes: determining an end of the AV lane that is not linked to another AV lane in the AV map based on the AV map data; determining a roadway segment of the roadway associated with the AV lane based on the AV map data; determining the coverage lane in the coverage map based on the roadway segment and the coverage map data; and generating a link between the AV lane and the coverage lane to be included in the hybrid map.

In some non-limiting embodiments or aspects, generating the link includes: determining a distance between the end of the AV lane and an end of the coverage lane based on the AV map data and the coverage map data; and generating a hybrid lane between the end of the AV lane and the end of the coverage lane to be included in the hybrid map, the hybrid lane including: a first end linking the end of the AV lane; and a second end linking the end of the coverage lane.

In some non-limiting embodiments or aspects, the method further includes generating a hybrid lane between the AV lane and the coverage lane, wherein the route includes the AV lane linked to the hybrid lane and the hybrid lane linked to the coverage lane.

In some non-limiting embodiments or aspects, the AV map includes a plurality of lanes, the plurality of lanes including the AV lane linked to another AV lane, wherein the AV map data is associated with an indication of whether the AV can operate under a fully-autonomous mode in the plurality of AV lanes, and generating the hybrid map further includes: modifying the AV map to unlink the AV lane and the another AV lane in the AV map based on the indication.

In some non-limiting embodiments or aspects, the AV map data is associated with an indication that the AV can operate in the AV lane under a fully-autonomous mode, and wherein the coverage map data is associated with an indication that the AV can operate in the coverage lane under a partially-autonomous mode or a manual mode.

In some non-limiting embodiments or aspects, the AV map data is associated with one or more traversals of the roadway in the geographic location by one or more AVs.

According to some non-limiting embodiments or aspects, provided is a computing system that includes one or more processors configured to: receive AV map data associated with an AV map of a geographic location, wherein the AV map data is associated with an AV lane of a roadway in the geographic location; receive coverage map data associated with a coverage map of the geographic location, wherein the coverage map data is associated with a coverage lane of the roadway in the geographic location; generate a hybrid map of the geographic location based on the AV map data and the coverage map data, wherein the hybrid map includes the AV lane linked with the coverage lane; and provide hybrid map data associated with the hybrid map for routing of an AV.

In some non-limiting embodiments or aspects, the one or more processors are further p configured to: determine an end of the AV lane that is not linked to another AV lane in the AV map based on the AV map data; determine a roadway segment of the roadway associated with the AV lane based on the AV map data; determine the coverage lane in the coverage map based on the roadway segment and the coverage map data; and generate a link between the AV lane and the coverage lane to be included in the hybrid map.

In some non-limiting embodiments or aspects, the one or more processors are further configured to: determine a distance between the end of the AV lane and an end of the coverage lane based on the AV map data and the coverage map data; and generate a hybrid lane between the end of the AV lane and the end of the coverage lane to be included in the hybrid map, the hybrid lane including: a first end linking the end of the AV lane; and a second end linking the end of the coverage lane.

In some non-limiting embodiments or aspects, the one or more processors are further configured to: generate a hybrid lane between the AV lane and the coverage lane, wherein the route includes the AV lane linked to the hybrid lane and the hybrid lane linked to the coverage lane.

In some non-limiting embodiments or aspects, the AV map includes a plurality of lanes including the AV lane linked to another AV lane, wherein the AV map data is associated with an indication of whether the AV can operate under a fully-autonomous mode in the plurality of AV lanes, and wherein the one or more processors are further configured to: modify the AV map to unlink the AV lane and the another AV lane in the AV map based on the indication.

In some non-limiting embodiments or aspects, the AV map data is associated with an indication that the AV can operate in the AV lane under a fully-autonomous mode, and wherein the coverage map data is associated with an indication that the AV can operate in the coverage lane under a partially-autonomous mode or a manual mode.

In some non-limiting embodiments or aspects, the AV map data is associated with one or more traversals of the roadway in the geographic location by one or more AVs.

According to some non-limiting embodiments or aspects, provided is an AV including: a vehicle computing system including one or more processors, wherein the vehicle computing system is configured to: receive hybrid map data associated with a hybrid map of a geographic location, wherein the hybrid map includes an AV lane linked with a coverage lane of a roadway in the geographic location, wherein the hybrid map data is associated with an indication that the AV can operate under a fully-autonomous mode in the AV lane on the roadway and an indication that the AV can operate in the coverage lane under a partially-autonomous mode or a manual mode, determine a route including the AV lane linked with the coverage lane of the roadway in the geographic location based on the hybrid map data.

In some non-limiting embodiments or aspects, the AV further includes one or more sensors for detecting an object in an environment surrounding the AV, wherein the vehicle computing system is further configured to: control travel of the AV on at least a portion of the route based on sensor data from the one or more sensors and the hybrid map data associated with the hybrid map.

In some non-limiting embodiments or aspects, the AV further includes a positioning system configured to determine a position of the AV, wherein the vehicle computing system is further configured to: control the AV to operate under the fully-autonomous mode on the at least a portion of the route; and control the AV to operate under the partially-autonomous mode or the manual mode on at least another portion of the route based on positioning data from the positioning system and the hybrid map data associated with the hybrid map.

In some non-limiting embodiments or aspects, the vehicle computing system is further configured to: determine, based on the positioning data from the positioning system and the hybrid map data, that the AV is operating under the fully-autonomous mode in the AV lane on the route including the AV lane linked to the coverage lane; and control the AV to switch from operating under the fully-autonomous mode to operating under the partially-autonomous mode or the manual mode in the AV lane based on determining that the AV is operating under the fully-autonomous mode in the AV lane.

In some non-limiting embodiments or aspects, the vehicle computing system is further configured to: receive a request for service, wherein the request for service is associated with request data associated with a pick-up location and a drop-off location in the geographic location; and determine a route between the pick-up location and the drop-off location in the geographic location that includes the AV lane linked with the coverage lane based on the hybrid map data.

In some non-limiting embodiments or aspects, the AV lane is linked to the coverage lane by a hybrid lane, wherein the hybrid map data is associated with an indication that the AV can operate in the hybrid lane under the partially-autonomous mode or the manual mode.

Further non-limiting embodiments or aspects are set forth in the following numbered clauses:

Clause 1. A method comprising: receiving, with a computer system comprising one or more processors, autonomous vehicle (AV) map data associated with an AV map of a geographic location, wherein the AV map data is associated with an AV lane of a roadway in the geographic location; receiving, with the computer system, coverage map data associated with a coverage map of the geographic location, wherein the coverage map data is associated with a coverage lane of the roadway in the geographic location; generating, with the computer system, a hybrid map of the geographic location based on the AV map data and the coverage map data, wherein the hybrid map includes the AV lane linked with the coverage lane of the roadway; and providing, with the computer system, hybrid map data associated with the hybrid map for routing of an AV.

Clause 2. The method of clause 1, wherein generating the hybrid map comprises: determining an end of the AV lane that is not linked to another AV lane in the AV map based on the AV map data; determining a roadway segment of the roadway associated with the AV lane based on the AV map data; determining the coverage lane in the coverage map based on the roadway segment and the coverage map data; and generating a link between the AV lane and the coverage lane to be included in the hybrid map.

Clause 3. The method of any of clauses 1 and 2, wherein generating the link comprises: determining a distance between the end of the AV lane and an end of the coverage lane based on the AV map data and the coverage map data; and generating a hybrid lane between the end of the AV lane and the end of the coverage lane to be included in the hybrid map, the hybrid lane comprising: a first end linking the end of the AV lane; and a second end linking the end of the coverage lane.

Clause 4. The method of any of clauses 1-3, further comprising: generating a hybrid lane between the AV lane and the coverage lane, wherein the route includes the AV lane linked to the hybrid lane and the hybrid lane linked to the coverage lane.

Clause 5. The method of any of clauses 1-4, wherein the AV map includes a plurality of lanes, the plurality of lanes including the AV lane linked to another AV lane, wherein the AV map data is associated with an indication of whether the AV can operate under a fully-autonomous mode in the plurality of AV lanes, and wherein generating the hybrid map further comprises: modifying the AV map to unlink the AV lane and the another AV lane in the AV map based on the indication.

Clause 6. The method of any of clauses 1-5, wherein the AV map data is associated with an indication that the AV can operate in the AV lane under a fully-autonomous mode, and wherein the coverage map data is associated with an indication that the AV can operate in the coverage lane under a partially-autonomous mode or a manual mode.

Clause 7. The method of any of clauses 1-6, wherein the AV map data is associated with one or more traversals of the roadway in the geographic location by one or more AVs.

Clause 8. A computing system comprising: one or more processors configured to: receive autonomous vehicle (AV) map data associated with an AV map of a geographic location, wherein the AV map data is associated with an AV lane of a roadway in the geographic location; receive coverage map data associated with a coverage map of the geographic location, wherein the coverage map data is associated with a coverage lane of the roadway in the geographic location; generate a hybrid map of the geographic location based on the AV map data and the coverage map data, wherein the hybrid map includes the AV lane linked with the coverage lane; and provide hybrid map data associated with the hybrid map for routing of an AV.

Clause 9. The computing system of clause 8, wherein the one or more processors are further configured to: determine an end of the AV lane that is not linked to another AV lane in the AV map based on the AV map data; determine a roadway segment of the roadway associated with the AV lane based on the AV map data; determine the coverage lane in the coverage map based on the roadway segment and the coverage map data; and generate a link between the AV lane and the coverage lane to be included in the hybrid map.

Clause 10. The computing system of any of clauses 8 and 9, wherein the one or more processors are further configured to: determine a distance between the end of the AV lane and an end of the coverage lane based on the AV map data and the coverage map data; and generate a hybrid lane between the end of the AV lane and the end of the coverage lane to be included in the hybrid map, the hybrid lane comprising: a first end linking the end of the AV lane; and a second end linking the end of the coverage lane.

Clause 11. The computing system of any of clauses 8-10, wherein the one or more processors are further configured to: generate a hybrid lane between the AV lane and the coverage lane, wherein the route includes the AV lane linked to the hybrid lane and the hybrid lane linked to the coverage lane.

Clause 12. The computing system of any of clauses 8-11, wherein the AV map includes a plurality of lanes including the AV lane linked to another AV lane, wherein the AV map data is associated with an indication of whether the AV can operate under a fully-autonomous mode in the plurality of AV lanes, and wherein the one or more processors are further configured to: modify the AV map to unlink the AV lane and the another AV lane in the AV map based on the indication.

Clause 13. The computing system of any of clauses 8-12, wherein the AV map data is associated with an indication that the AV can operate in the AV lane under a fully-autonomous mode, and wherein the coverage map data is associated with an indication that the AV can operate in the coverage lane under a partially-autonomous mode or a manual mode.

Clause 14. The computing system of any of clauses 8-13, wherein the AV map data is associated with one or more traversals of the roadway in the geographic location by one or more AVs.

Clause 15. An autonomous vehicle (AV) comprising: a vehicle computing system comprising one or more processors, wherein the vehicle computing system is configured to: receive hybrid map data associated with a hybrid map of a geographic location, wherein the hybrid map includes an AV lane linked with a coverage lane of a roadway in the geographic location, wherein the hybrid map data is associated with an indication that the AV can operate under a fully-autonomous mode in the AV lane on the roadway and an indication that the AV can operate in the coverage lane under a partially-autonomous mode or a manual mode, determine a route including the AV lane linked with the coverage lane of the roadway in the geographic location based on the hybrid map data.

Clause 16. The AV of clause 15 further comprising: one or more sensors for detecting an object in an environment surrounding the AV, wherein the vehicle computing system is further configured to: control travel of the AV on at least a portion of the route based on sensor data from the one or more sensors and the hybrid map data associated with the hybrid map.

Clause 17. The AV of any of clauses 15 and 16 further comprising: a positioning system configured to determine a position of the AV, wherein the vehicle computing system is further configured to: control the AV to operate under the fully-autonomous mode on the at least a portion of the route; and control the AV to operate under the partially-autonomous mode or the manual mode on at least another portion of the route based on positioning data from the positioning system and the hybrid map data associated with the hybrid map.

Clause 18. The AV of any of clauses 15-17, wherein the vehicle computing system is further configured to: determine, based on the positioning data from the positioning system and the hybrid map data, that the AV is operating under the fully-autonomous mode in the AV lane on the route including the AV lane linked to the coverage lane; and control the AV to switch from operating under the fully-autonomous mode to operating under the partially-autonomous mode or the manual mode in the AV lane based on determining that the AV is operating under the fully-autonomous mode in the AV lane.

Clause 19. The AV of any of clauses 15-18, wherein the vehicle computing system is further configured to: receive a request for service, wherein the request for service is associated with request data associated with a pick-up location and a drop-off location in the geographic location; and determine a route between the pick-up location and the drop-off location in the geographic location that includes the AV lane linked with the coverage lane based on the hybrid map data.

Clause 20. The AV of any of clauses 15-19, wherein the AV lane is linked to the coverage lane by a hybrid lane, wherein the hybrid map data is associated with an indication that the AV can operate in the hybrid lane under the partially-autonomous mode or the manual mode.

DETAILED DESCRIPTION

Figure 1:
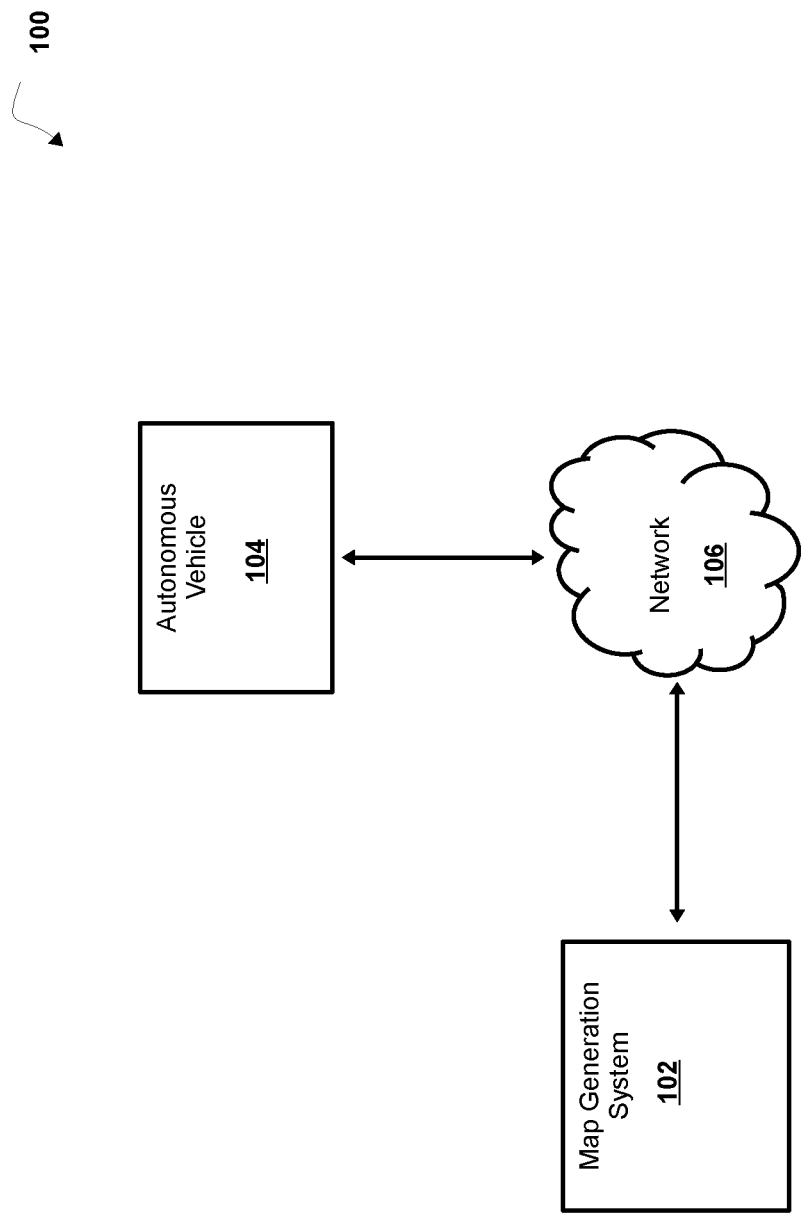
FIG. 1 is a diagram of a non-limiting embodiment of an environment in which systems and/or methods, described herein, can be implemented.

The following detailed description of non-limiting embodiments refers to the accompanying drawings. The same reference numbers in different drawings may identify the same or similar elements.

In some non-limiting embodiments, an autonomous vehicle (AV) map of a geographic location is used for routing an AV on roadways specified in the AV map. For example, a route including one or more AV lanes on one or more roadway segments is determined for the AV between a pick-up location (or a current location) and a destination location based on the AV map. As an example, the AV travels autonomously (e.g., in a fully-autonomous mode) in the one or more AV lanes on the one or more roadway segments between the pick-up location (or the current location) and the destination location.

However, an AV map (e.g., an AV map, one or more submaps of an AV map, etc.) may not include lanes on roadway segments over which an AV can be operated, routed, and/or travel in or under a partially-autonomous mode or a manual mode (e.g., lanes on roadway segments over which an AV cannot be operated, routed, and/or travel in or under the fully-autonomous mode). For example, the AV may not be allowed to operate (e.g., route, travel, and/or perform one or more functionalities associated with the fully-autonomous mode, such as, functionalities associated with fully-autonomous operation of the AV performed during fully-autonomous operation and/or travel of the AV, etc.) over roadway segments over which the AV cannot operate in or under the fully-autonomous mode in AV lanes based on the AV map (e.g., over which the AV cannot travel and/or be routed to travel fully-autonomously in AV lanes based on the AV map). Additionally, or alternatively, lanes and/or roadway segments over which the AV cannot operate in or under the fully-autonomous mode based on the AV map may be removed from and/or not included in the AV map. In this way, an AV map may be less complete and/or result in less efficient processing for operating the AV (e.g., for routing the AV, controlling travel of the AV, and/or performing one or more functionalities of the AV, etc.). In addition, an AV may have fewer operating options (e.g., fewer options for routing the AV, controlling travel of the AV, and/or performing one or more functionalities of the AV, etc.), may experience processing delays associated with communications (e.g., for receiving additional routing data, etc.), and/or may implement additional processing functions to modify or augment the AV map for non-autonomous routing.

As disclosed herein, in some non-limiting embodiments, a map generation system receives AV map data associated with an AV map of a geographic location and coverage map data associated with a coverage map of the geographic location, and the map generation system generates a hybrid map of the geographic location based on the AV map data and the coverage map data. The map generation system provides hybrid map data associated with the hybrid map for routing of an AV. In this way, the map generation system generates and/or provides a hybrid map of the geographic location that includes an AV lane over which the AV can operate in or under a fully-autonomous mode (e.g., over which the AV can be routed for fully-autonomous travel) linked to a coverage lane over which the AV can operate in or under a partially-autonomous mode or a manual mode (e.g., over which the AV can be routed for partially-autonomous or manual travel). Accordingly, the map generation system generates a more complete map for AV routing that enables more efficient processing for operating the AV and provides more roadway options for routing the AV.

As disclosed herein, in some non-limiting embodiments, a vehicle computing system of an AV receives hybrid map data associated with a hybrid map of a geographic location and determines a route including an AV lane linked with a coverage lane of a roadway in a geographic location based on the hybrid map data. The hybrid map includes the AV lane linked with the coverage lane of the roadway in the geographic location. The hybrid map data is associated with an indication that the AV can operate under a fully-autonomous mode in the AV lane on the roadway and an indication that the AV can operate under a partially-autonomous mode or a manual mode in the coverage lane on the roadway. In this way, the vehicle computing system determines a route that enables both operation in or under the fully-autonomous mode (e.g., fully-autonomous travel and/or routing for fully-autonomous travel based on an AV lane) and operation in or under the partially-autonomous mode or the manual mode (e.g., partially-autonomous travel or manual travel and/or routing for partially-autonomous travel or manual travel based on a coverage lane) of the AV traveling on the route. Accordingly, the hybrid map enables the vehicle computing system to generate a route in a more efficient manner with less processing delays and/or routing for the AV to be performed by the vehicle processing system (e.g., completely by the vehicle processing system).

In some non-limiting embodiments, a functionality associated with the fully-autonomous mode (e.g., with fully-autonomous operation of the AV performed during fully-autonomous travel of the AV) is not performed in the partially-autonomous mode or the manual mode (e.g., during partially-autonomous or manual, non-autonomous travel of the AV). For example, some functionalities associated with the fully-autonomous mode and/or systems associated with control of fully-autonomous travel of the AV in the fully-autonomous mode may not be performed during travel of the AV in the partially-autonomous mode or the manual mode. As an example, higher resolution localization operations and/or systems, such as localization based on LIDAR point clouds and/or precise pose positioning, may not be available for travel of the AV in a coverage lane in the partially-autonomous mode or the manual mode, for example, because coverage data associated with the coverage lane may not provide a sufficient level of detail or resolution to implement the higher resolution localization operations and/or systems.

Referring now to FIG. 1, FIG. 1 is a diagram of a non-limiting embodiment of an environment 100 in which systems and/or methods, described herein, can be implemented. As shown in FIG. 1, environment 100 includes map generation system 102, autonomous vehicle 104, and network 106. Systems and/or devices of environment 100 can interconnect via wired connections, wireless connections, or a combination of wired and wireless connections.

In some non-limiting embodiments, map generation system 102 includes one or more devices capable of receiving AV map data, receiving coverage map data, generating a hybrid map based on the AV map data and the coverage map data, and/or providing hybrid map data associated with the hybrid map for routing of autonomous vehicle 104. For example, map generation system 102 can include one or more computing systems including one or more processors (e.g., one or more servers, etc.).

In some non-limiting embodiments, autonomous vehicle 104 includes one or more devices capable of receiving hybrid map data and determining a route based on the hybrid map data. In some non-limiting embodiments, autonomous vehicle 104 includes one or more devices capable of controlling travel, operation, and/or routing of autonomous vehicle 104 on the route based on the hybrid map data. In some non-limiting embodiments, autonomous vehicle 104 includes one or more devices capable of receiving AV map data, receiving coverage map data, generating a hybrid map based on the AV map data and the coverage map data, and/or providing hybrid map data associated with the hybrid map for routing of autonomous vehicle 104. For example, autonomous vehicle 104 can include one or more computing systems including one or more processors (e.g., one or more servers, etc.). Further details regarding non-limiting embodiments of autonomous vehicle 104 are provided below with regard to FIG. 2.

In some non-limiting embodiments, map generation system 102 and/or autonomous vehicle 104 include one or more devices capable of receiving, storing, and/or providing map data (e.g., map data, AV map data, coverage map data, hybrid map data, submap data, etc.) associated with a map (e.g., a map, a submap, an AV map, a coverage, map, a hybrid map, etc.) of a geographic location (e.g., a country, a state, a city, a portion of a city, a township, a portion of a township, etc.). For example, maps are used for routing autonomous vehicle 104 on a roadway specified in the map.

In some non-limiting embodiments, network 106 includes one or more wired and/or wireless networks. For example, network 106 includes a cellular network (e.g., a long-term evolution (LTE) network, a third generation (3G) network, a fourth generation (4G) network, a code division multiple access (CDMA) network, etc.), a public land mobile network (PLMN), a local area network (LAN), a wide area network (WAN), a metropolitan area network (MAN), a telephone network (e.g., the public switched telephone network (PSTN)), a private network, an ad hoc network, an intranet, the Internet, a fiber optic-based network, a cloud computing network, and/or the like, and/or a combination of these or other types of networks.

The number and arrangement of systems, devices, and networks shown in FIG. 1 are provided as an example. There can be additional systems, devices and/or networks, fewer systems, devices, and/or networks, different systems, devices and/or networks, or differently arranged systems, devices, and/or networks than those shown in FIG. 1. Furthermore, two or more systems or devices shown in FIG. 1 can be implemented within a single system or a single device, or a single system or a single device shown in FIG. 1 can be implemented as multiple, distributed systems or devices. Additionally, or alternatively, a set of systems or a set of devices (e.g., one or more systems, one or more devices) of environment 100 can perform one or more functions described as being performed by another set of systems or another set of devices of environment 100.

Figure 2:
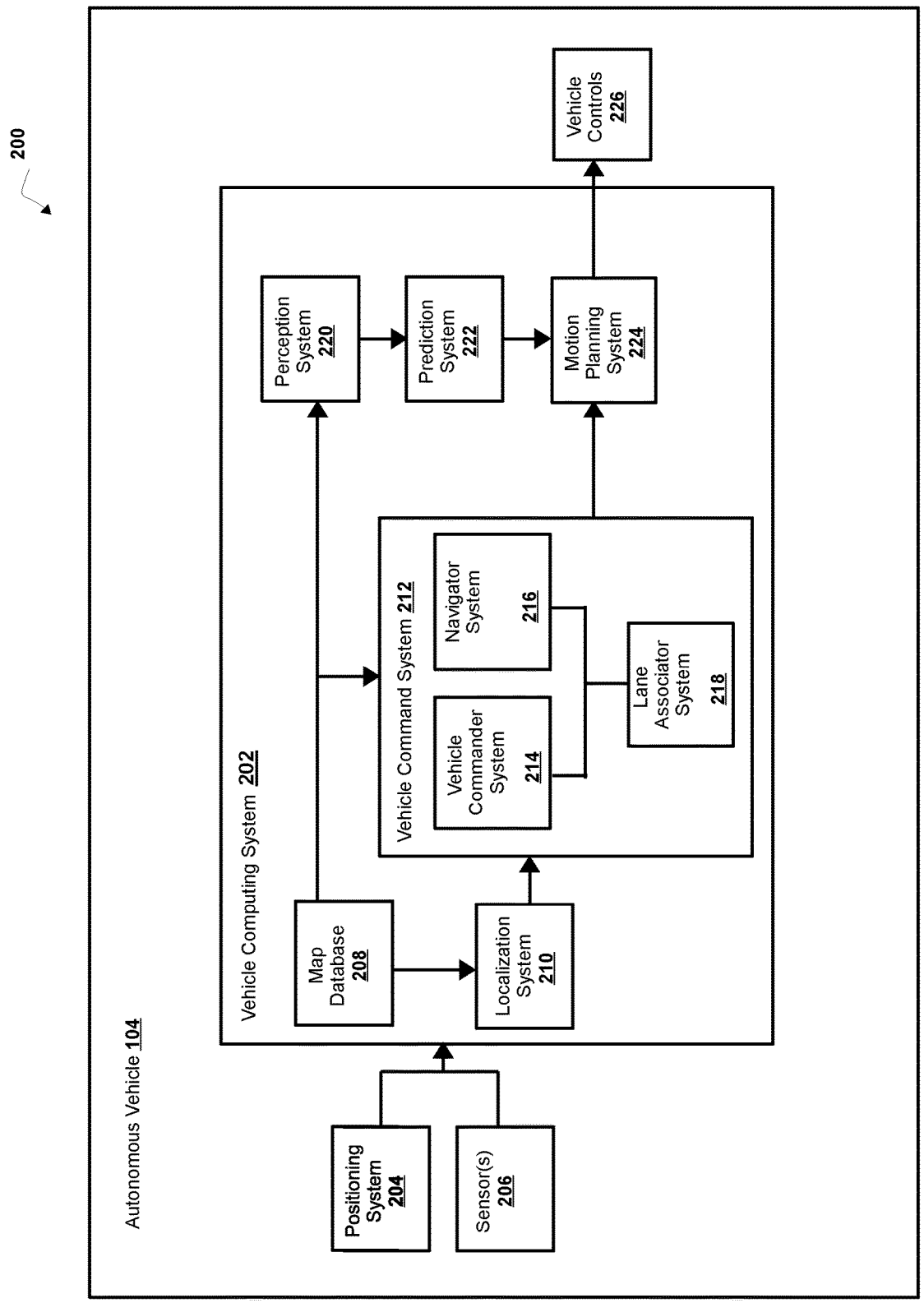
FIG. 2 is a diagram of a non-limiting embodiment of a system for controlling an autonomous vehicle shown in FIG. 1.

Referring now to FIG. 2, FIG. 2 is a diagram of a non-limiting embodiment of a system 200 for controlling autonomous vehicle 104. As shown in FIG. 2, vehicle computing system 202 includes vehicle command system 212, perception system 220, prediction system 222, and motion planning system 224 that cooperate to perceive a surrounding environment of autonomous vehicle 104, determine a motion plan and control the motion (e.g., the direction of travel) of autonomous vehicle 104 accordingly.

In some non-limiting embodiments, vehicle computing system 202 is connected to or includes positioning system 204. In some non-limiting embodiments, positioning system 204 determines a position (e.g., a current position, a past position, etc.) of autonomous vehicle 104. In some non-limiting embodiments, positioning system 204 determines a position of autonomous vehicle 104 based on an inertial sensor, a satellite positioning system, an IP address (e.g., an IP address of autonomous vehicle 104, an IP address of a device in autonomous vehicle 104, etc.), triangulation based on network components (e.g., network access points, cellular towers, Wi-Fi access points, etc.), and/or proximity to network components, and/or the like. In some non-limiting embodiments, the position of autonomous vehicle 104 is used by vehicle computing system 202.

In some non-limiting embodiments, vehicle computing system 202 receives sensor data from one or more sensors 206 that are coupled to or otherwise included in autonomous vehicle 104. For example, one or more sensors 206 includes a Light Detection and Ranging (LIDAR) system, a Radio Detection and Ranging (RADAR) system, one or more cameras (e.g., visible spectrum cameras, infrared cameras, etc.), and/or the like. In some non-limiting embodiments, the sensor data includes data that describes a location of objects within the surrounding environment of the autonomous vehicle 104. In some non-limiting embodiments, one or more sensors 206 collect sensor data that includes data that describes a location (e.g., in three-dimensional space relative to the autonomous vehicle 104) of points that correspond to objects within the surrounding environment of autonomous vehicle 104.

In some non-limiting embodiments, the sensor data includes a location (e.g., a location in three-dimensional space relative to the LIDAR system) of a number of points (e.g., a point cloud) that correspond to objects that have reflected a ranging laser. In some non-limiting embodiments, the LIDAR system measures distances by measuring a Time of Flight (TOF) that a short laser pulse takes to travel from a sensor of the LIDAR system to an object and back, and the LIDAR system calculates the distance of the object to the LIDAR system based on the known speed of light. In some non-limiting embodiments, map data includes LIDAR point cloud maps associated with a geographic location (e.g., a location in three-dimensional space relative to the LIDAR system of a mapping vehicle) of a number of points (e.g., a point cloud) that correspond to objects that have reflected a ranging laser of one or more mapping vehicles at the geographic location. As an example, a map can include a LIDAR point cloud layer that represents objects and distances between objects in the geographic location of the map.

In some non-limiting embodiments, the sensor data includes a location (e.g., a location in three-dimensional space relative to the RADAR system) of a number of points that correspond to objects that have reflected a ranging radio wave. In some non-limiting embodiments, radio waves (e.g., pulsed radio waves or continuous radio waves) transmitted by the RADAR system can reflect off an object and return to a receiver of the RADAR system. The RADAR system can then determine information about the object's location and/or speed. In some non-limiting embodiments, the RADAR system provides information about the location and/or the speed of an object relative to the RADAR system based on the radio waves.

In some non-limiting embodiments, image processing techniques (e.g., range imaging techniques such as, for example, structure from motion, structured light, stereo triangulation, etc.) can be performed by system 200 to identify a location (e.g., in three-dimensional space relative to the one or more cameras) of a number of points that correspond to objects that are depicted in images captured by one or more cameras. Other sensors can identify the location of points that correspond to objects as well.

In some non-limiting embodiments, map database 208 provides detailed information associated with the map, features of the roadway in the geographic location, and information about the surrounding environment of the autonomous vehicle 104 for the autonomous vehicle to use while driving (e.g. traversing a route, planning a route, determining a motion plan, controlling the autonomous vehicle, etc.).

In some non-limiting embodiments, vehicle computing system 202 receives a vehicle pose from localization system 210 based on one or more sensors 206 that are coupled to or otherwise included in autonomous vehicle 104. In some non-limiting embodiments, the localization system 210 includes a LIDAR localizer, a low quality pose localizer, and/or a pose filter. For example, the localization system uses a pose filter that receives and/or determines one or more valid pose estimates (e.g. not based on invalid position data, etc.) from the LIDAR localizer and/or the low quality pose localizer, for determining a map-relative vehicle pose. For example, low quality pose localizer determines a low quality pose estimate in response to receiving position data from positioning system 204 for operating (e.g., routing, navigating, controlling, etc.) the autonomous vehicle 104 under manual control (e.g. in a coverage lane). In some non-limiting embodiments, LIDAR localizer determines a LIDAR pose estimate in response to receiving sensor data (e.g. LIDAR data, RADAR data, etc.) from sensors 206 for operating (e.g., routing, navigating, controlling, etc.) the autonomous vehicle 104 under autonomous control (e.g. in an AV lane).

In some non-limiting embodiments vehicle command system 212 includes vehicle commander system 214, navigator system 216, and lane associator system 218 that cooperate to route and/or navigate the autonomous vehicle 104 in a geographic location. In some non-limiting embodiments, vehicle commander system 214 provides tracking of a current objective of the autonomous vehicle 104, including a current service, a target pose, and/or a coverage plan (e.g. development testing, etc.). In some non-limiting embodiments, navigator system 216 determines and/or provides a route plan for the autonomous vehicle 104 based on the current state of the autonomous vehicle 104, map data (e.g. lane graph, etc.), and one or more vehicle commands (e.g. a target pose). For example, navigator system 216 determines a route plan (e.g., plan, re-plan, deviation, etc.) including one or more lanes (e.g., current lane, future lane, etc.) in one or more roadways that the autonomous vehicle 104 may traverse on a route to a destination (e.g. target, trip drop-off, etc.).

In some non-limiting embodiments, navigator system 216 determines a route plan based on one or more lanes received from lane associator system 218. In some non-limiting embodiments, lane associator system 218 determines one or more lanes of a route in response to receiving a vehicle pose from the localization system 210. For example, the lane associator system 218 determines, based on the vehicle pose, that the AV is on a coverage lane, and in response to determining that the AV is on the coverage lane, determines one or more candidate lanes (e.g. routable lanes) within a distance of the vehicle pose associated with the autonomous vehicle 104. For example, the lane associator system 218 determines, based on the vehicle pose, that the AV is on an AV lane, and in response to determining that the AV is on the AV lane, determines one or more candidate lanes (e.g. routable lanes) within a distance of the vehicle pose associated with the autonomous vehicle 104. In some non-limiting embodiments, navigator system 216 generates a cost function for each of one or more candidate lanes the autonomous vehicle 104 may traverse on a route to a destination. For example, navigator system 216 generates the cost function that describes a cost (e.g., a cost over a time period) of following (e.g., adhering to) one or more lanes that may be used to reach a target pose.

In some non-limiting embodiments, perception system 220 detects and/or tracks objects (e.g., vehicles, pedestrians, bicycles, and the like) that are proximate to (e.g., in proximity to the surrounding environment of) the autonomous vehicle 104 over a time period. In some non-limiting embodiments, perception system 220 can retrieve (e.g., obtain) map data from map database 208 that provides detailed information about the surrounding environment of the autonomous vehicle 104.

In some non-limiting embodiments, perception system 220 determines one or more objects that are proximate to autonomous vehicle 104 based on sensor data received from one or more sensors 206 and/or map data from map database 208. For example, perception system 220 determines, for the one or more objects that are proximate, state data associated with a state of such object. In some non-limiting embodiments, the state data associated with an object includes data associated with a location of the object (e.g., a position, a current position, an estimated position, etc.), data associated with a speed of the object (e.g., a magnitude of velocity of the object), data associated with a direction of travel of the object (e.g., a heading, a current heading, etc.), data associated with an acceleration rate of the object (e.g., an estimated acceleration rate of the object, etc.), data associated with an orientation of the object (e.g., a current orientation, etc.), data associated with a size of the object (e.g., a size of the object as represented by a bounding shape such as a bounding polygon or polyhedron, a footprint of the object, etc.), data associated with a type of the object (e.g., a class of the object, an object with a type of vehicle, an object with a type of pedestrian, an object with a type of bicycle, etc.), and/or the like.

In some non-limiting embodiments, perception system 220 determines state data for an object over a number of iterations of determining state data. For example, perception system 220 updates the state data for each object of a plurality of objects during each iteration.

In some non-limiting embodiments, prediction system 222 receives the state data associated with one or more objects from perception system 220. Prediction system 222 predicts one or more future locations for the one or more objects based on the state data. For example, prediction system 222 predicts the future location of each object of a plurality of objects within a time period (e.g., 5 seconds, 10 seconds, 20 seconds, etc.). In some non-limiting embodiments, prediction system 222 predicts that an object will adhere to the object's direction of travel according to the speed of the object. In some non-limiting embodiments, prediction system 222 uses machine learning techniques or modeling techniques to make a prediction based on state data associated with an object.

In some non-limiting embodiments, motion planning system 224 determines a motion plan for autonomous vehicle 104 based on a prediction of a location associated with an object provided by prediction system 222 and/or based on state data associated with the object provided by perception system 220. For example, motion planning system 224 determines a motion plan (e.g., an optimized motion plan) for the autonomous vehicle 104 that causes autonomous vehicle 104 to travel relative to the object based on the prediction of the location for the object provided by prediction system 222 and/or the state data associated with the object provided by perception system 220.

In some non-limiting embodiments, motion planning system 224 receives a route plan as a command from the navigator system 216. In some non-limiting embodiments, motion planning system 224 determines a cost function for each of one or more motion plans of a route for autonomous vehicle 104 based on the locations and/or predicted locations of one or more objects. For example, motion planning system 224 determines the cost function that describes a cost (e.g., a cost over a time period) of following (e.g., adhering to) a motion plan (e.g., a selected motion plan, an optimized motion plan, etc.). In some non-limiting embodiments, the cost associated with the cost function increases and/or decreases based on autonomous vehicle 104 deviating from a motion plan (e.g., a selected motion plan, an optimized motion plan, a preferred motion plan, etc.). For example, the cost associated with the cost function increases and/or decreases based on autonomous vehicle 104 deviating from the motion plan to avoid a collision with an object.

In some non-limiting embodiments, motion planning system 224 determines a cost of following a motion plan. For example, motion planning system 224 determines a motion plan for autonomous vehicle 104 based on one or more cost functions. In some non-limiting embodiments, motion planning system 224 determines a motion plan (e.g., a selected motion plan, an optimized motion plan, a preferred motion plan, etc.) that minimizes a cost function. In some non-limiting embodiments, motion planning system 224 provides a motion plan to vehicle controls 226 (e.g., a device that controls acceleration, a device that controls steering, a device that controls braking, an actuator that controls gas flow, etc.) to implement the motion plan.

Figure 3:
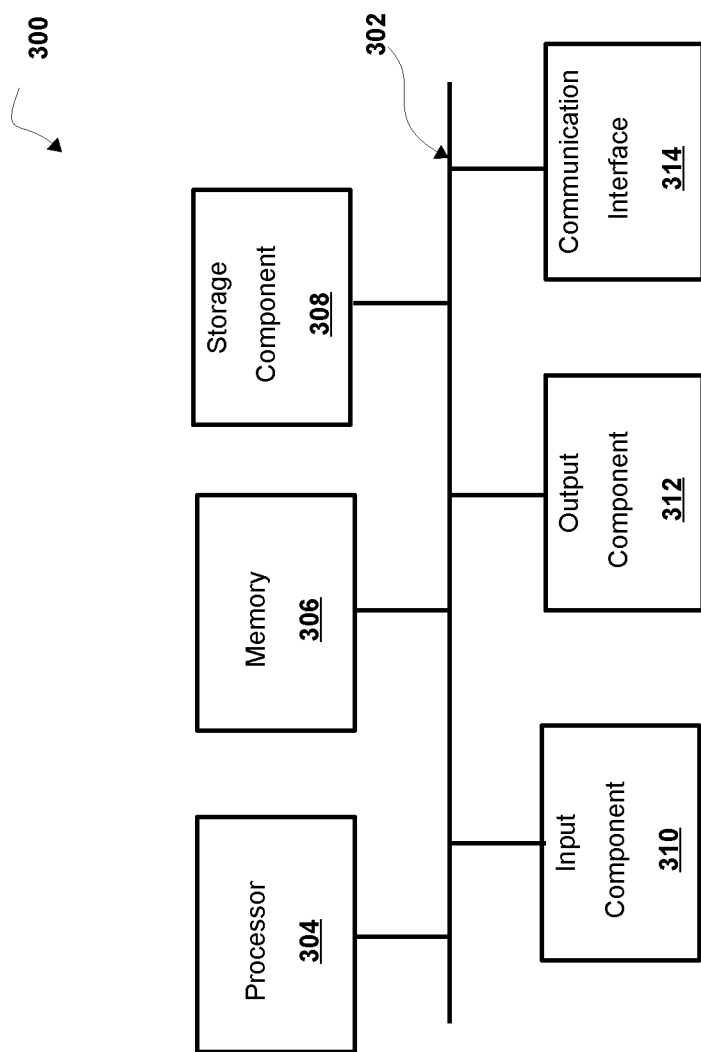
FIG. 3 is a diagram of a non-limiting embodiment of components of one or more devices of FIGS. 1 and 2.

Referring now to FIG. 3, FIG. 3 is a diagram of example components of a device 300. Device 300 can correspond to one or more devices of map generation system 102 and/or one or more devices (e.g., one or more devices of a system of) autonomous vehicle 104. In some non-limiting embodiments, one or more devices of map generation system 102 and/or one or more devices (e.g., one or more devices of a system) of autonomous vehicle 104 can include at least one device 300 and/or at least one component of device 300. As shown in FIG. 3, device 300 includes bus 302, processor 304, memory 306, storage component 308, input component 310, output component 312, and communication interface 314.

Bus 302 includes a component that permits communication among the components of device 300. In some non-limiting embodiments, processor 304 is implemented in hardware, firmware, or a combination of hardware and software. For example, processor 304 includes a processor (e.g., a central processing unit (CPU), a graphics processing unit (GPU), an accelerated processing unit (APU), etc.), a microprocessor, a digital signal processor (DSP), and/or any processing component (e.g., a field-programmable gate array (FPGA), an application-specific integrated circuit (ASIC), etc.) that can be programmed to perform a function. Memory 306 includes a random access memory (RAM), a read only memory (ROM), and/or another type of dynamic or static storage device (e.g., flash memory, magnetic memory, optical memory, etc.) that stores information and/or instructions for use by processor 304.

Storage component 308 stores information and/or software related to the operation and use of device 300. For example, storage component 308 includes a hard disk (e.g., a magnetic disk, an optical disk, a magneto-optic disk, a solid state disk, etc.), a compact disc (CD), a digital versatile disc (DVD), a floppy disk, a cartridge, a magnetic tape, and/or another type of computer-readable medium, along with a corresponding drive.

Input component 310 includes a component that permits device 300 to receive information, such as via user input (e.g., a touch screen display, a keyboard, a keypad, a mouse, a button, a switch, a microphone, etc.). Additionally, or alternatively, input component 310 includes a sensor for sensing information (e.g., a global positioning system (GPS) component, an accelerometer, a gyroscope, an actuator, etc.). Output component 312 includes a component that provides output information from device 300 (e.g., a display, a speaker, one or more light-emitting diodes (LEDs), etc.).

Communication interface 314 includes a transceiver-like component (e.g., a transceiver, a separate receiver and transmitter, etc.) that enables device 300 to communicate with other devices, such as via a wired connection, a wireless connection, or a combination of wired and wireless connections. Communication interface 314 can permit device 300 to receive information from another device and/or provide information to another device. For example, communication interface 314 includes an Ethernet interface, an optical interface, a coaxial interface, an infrared interface, a radio frequency (RF) interface, a universal serial bus (USB) interface, a Wi-Fi interface, a cellular network interface, and/or the like.

Device 300 can perform one or more processes described herein. Device 300 can perform these processes based on processor 304 executing software instructions stored by a computer-readable medium, such as memory 306 and/or storage component 308. A computer-readable medium (e.g., a non-transitory computer-readable medium) is defined herein as a non-transitory memory device. A memory device includes memory space located inside of a single physical storage device or memory space spread across multiple physical storage devices.

Software instructions can be read into memory 306 and/or storage component 308 from another computer-readable medium or from another device via communication interface 314. When executed, software instructions stored in memory 306 and/or storage component 308 cause processor 304 to perform one or more processes described herein. Additionally, or alternatively, hardwired circuitry can be used in place of or in combination with software instructions to perform one or more processes described herein. Thus, embodiments described herein are not limited to any specific combination of hardware circuitry and software.

The number and arrangement of components shown in FIG. 3 are provided as an example. In some non-limiting embodiments, device 300 includes additional components, fewer components, different components, or differently arranged components than those shown in FIG. 3. Additionally, or alternatively, a set of components (e.g., one or more components) of device 300 can perform one or more functions described as being performed by another set of components of device 300.

Figure 4:
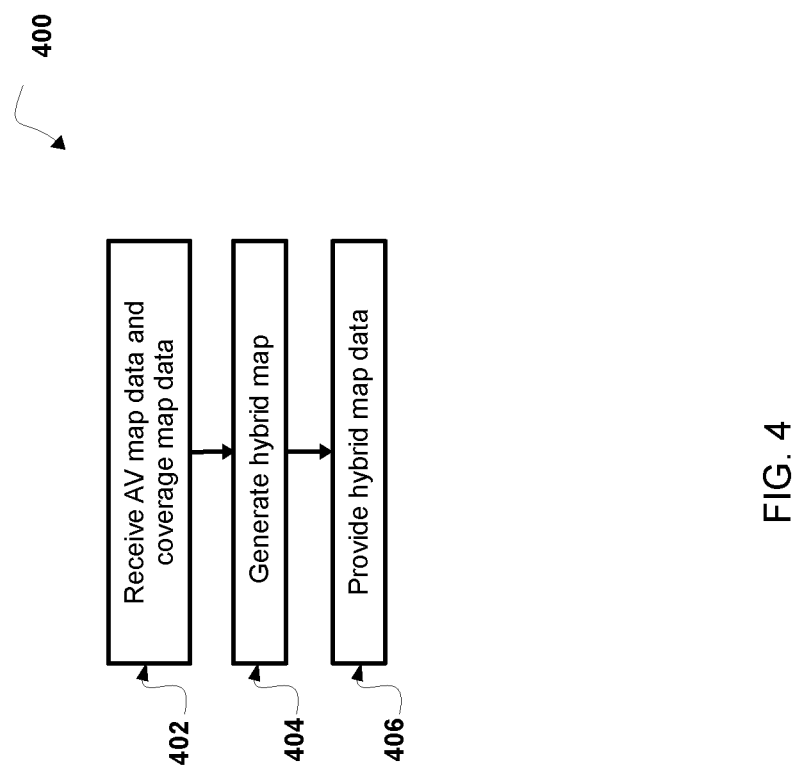
FIG. 4 is a flowchart of a non-limiting embodiment of a process for generating a hybrid map.

Referring now to FIG. 4, FIG. 4 is a flowchart of a non-limiting embodiment of a process 400 for generating a hybrid map. In some non-limiting embodiments, one or more of the steps of process 400 are performed (e.g., completely, partially, etc.) by map generation system 102 (e.g., one or more devices of map generation system 102). In some non-limiting embodiments, one or more of the steps of process 400 are performed (e.g., completely, partially, etc.) by another device or a group of devices separate from or including map generation system 102, such as autonomous vehicle 104 (e.g., one or more devices of autonomous vehicle 104).

As shown in FIG. 4, at step 402, process 400 includes receiving AV map data associated with an AV map of a geographic location and coverage map data associated with a coverage map of the geographic location. For example, map generation system 102 receives AV map data associated with an AV map of a geographic location and coverage map data associated with a coverage map of the geographic location from a database (e.g., a database associated with map generation system 102, a database located in map generation system 102, a database remote from map generation system 102, etc.).

In some non-limiting embodiments, map data includes data associated with a road (e.g., an identity and/or a location of a roadway of a road, an identity and/or location of a segment of a road, etc.), data associated with an object in proximity to a road (e.g., a building, a lamppost, a crosswalk, a curb of the road, etc.), data associated with a lane of a roadway (e.g., the location and/or direction of a travel lane, a parking lane, a turning lane, a bicycle lane, etc.), data associated with traffic control of a road (e.g., the location of and/or instructions associated with lane markings, traffic signs, traffic lights, etc.), and/or the like. In some non-limiting embodiments, a map of a geographic location includes one or more routes that include one or more roadways.

In some non-limiting embodiments, a road refers to a paved or otherwise improved path between two places that allows for travel by a vehicle (e.g., autonomous vehicle 104). Additionally, or alternatively, a road includes a roadway and a sidewalk in proximity to (e.g., adjacent, near, next to, touching, etc.) the roadway. In some non-limiting embodiments, a roadway includes a portion of road on which a vehicle is intended to travel and is not restricted by a physical barrier or by separation so that the vehicle is able to travel laterally. Additionally, or alternatively, a roadway (e.g., one or more roadway segments) includes one or more lanes, such as a travel lane (e.g., a lane upon which a vehicle travels, a traffic lane, etc.), a parking lane (e.g., a lane in which a vehicle parks), a bicycle lane (e.g., a lane in which a bicycle travels), a turning lane (e.g., a lane in which a vehicle turns from), and/or the like. In some non-limiting embodiments, a roadway is connected to another roadway, for example a lane of a roadway is connected to another lane of the roadway and/or a lane of the roadway is connected to a lane of another roadway.

In some non-limiting embodiments, a roadway is associated with map data (e.g., map data, AV map data, coverage map data, hybrid map data, submap data, etc.) that defines one or more attributes of (e.g., metadata associated with) the roadway (e.g., attributes of a roadway in a geographic location, attributes of a segment of a roadway, attributes of a lane of a roadway, etc.). In some non-limiting embodiments, an attribute of a roadway includes a road edge of a road (e.g., a location of a road edge of a road, a distance of location from a road edge of a road, an indication whether a location is within a road edge of a road, etc.), an intersection, connection, or link of a road with another road, a roadway of a road, a distance of a roadway from another roadway (e.g., a distance of an end of a lane and/or a roadway segment or extent to an end of another lane and/or an end of another roadway segment or extent, etc.), a lane of a roadway of a road (e.g., a travel lane of a roadway, a parking lane of a roadway, a turning lane of a roadway, lane markings, a direction of travel in a lane of a roadway, etc.), one or more objects (e.g., a vehicle, vegetation, a pedestrian, a structure, a building, a sign, a lamppost, signage, a traffic sign, a bicycle, a railway track, a hazardous object, etc.) in proximity to and/or within a road (e.g., objects in proximity to the road edges of a road and/or within the road edges of a road), a sidewalk of a road, and/or the like. In some non-limiting embodiments, an attribute of a roadway includes one or more features of the roadway associated with one or more traversals of the roadway by one or more AVs, a number of traversals of the roadway by one or more AVs, a number of interventions associated with one or more traversals of the roadway by one or more AVs, a number of objects (e.g., a number of hazards, a number of bicycles, a railway track in proximity to the roadway, etc.) associated with one or more traversals of the roadway by one or more AVs, a distance (e.g., an average distance, a mile, etc.) associated with one or more traversals of the roadway by one or more AVs (e.g., a distance until a detection of a hazardous event, a distance until detection of a potentially harmful or a harmful event to an AV, to a rider of the AV, to a pedestrian, a distance between a first detection of a hazardous event and a second detection of a hazardous event, miles per harmful event, etc.), one or more traffic controls of the roadway associated with one or more traversals of the roadway by one or more AVs, one or more aspects of the roadway (e.g., a dimension of one or more lanes of the roadway, a width of one or more lanes of the roadway, a number of bicycle lanes of the roadway, etc.) associated with one or more traversals of the roadway by one or more AVs, a speed of one or more AVs associated with one or more traversals of the roadway by the one or more AVs, and/or the like.

Figure 7A:
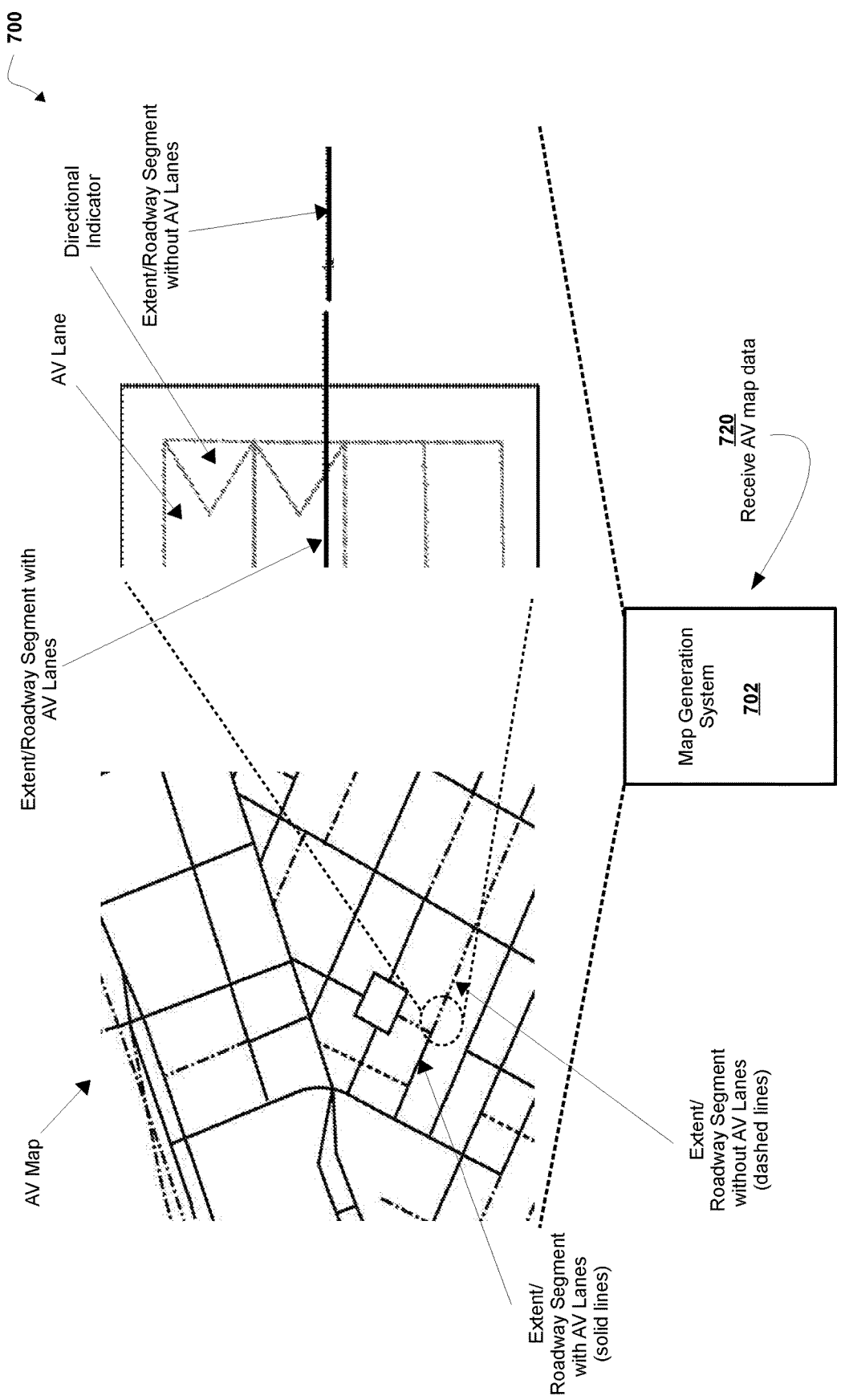
FIGS. 7A-7E are diagrams of an implementation of a non-limiting embodiment of a process disclosed herein.
Figure 7B:
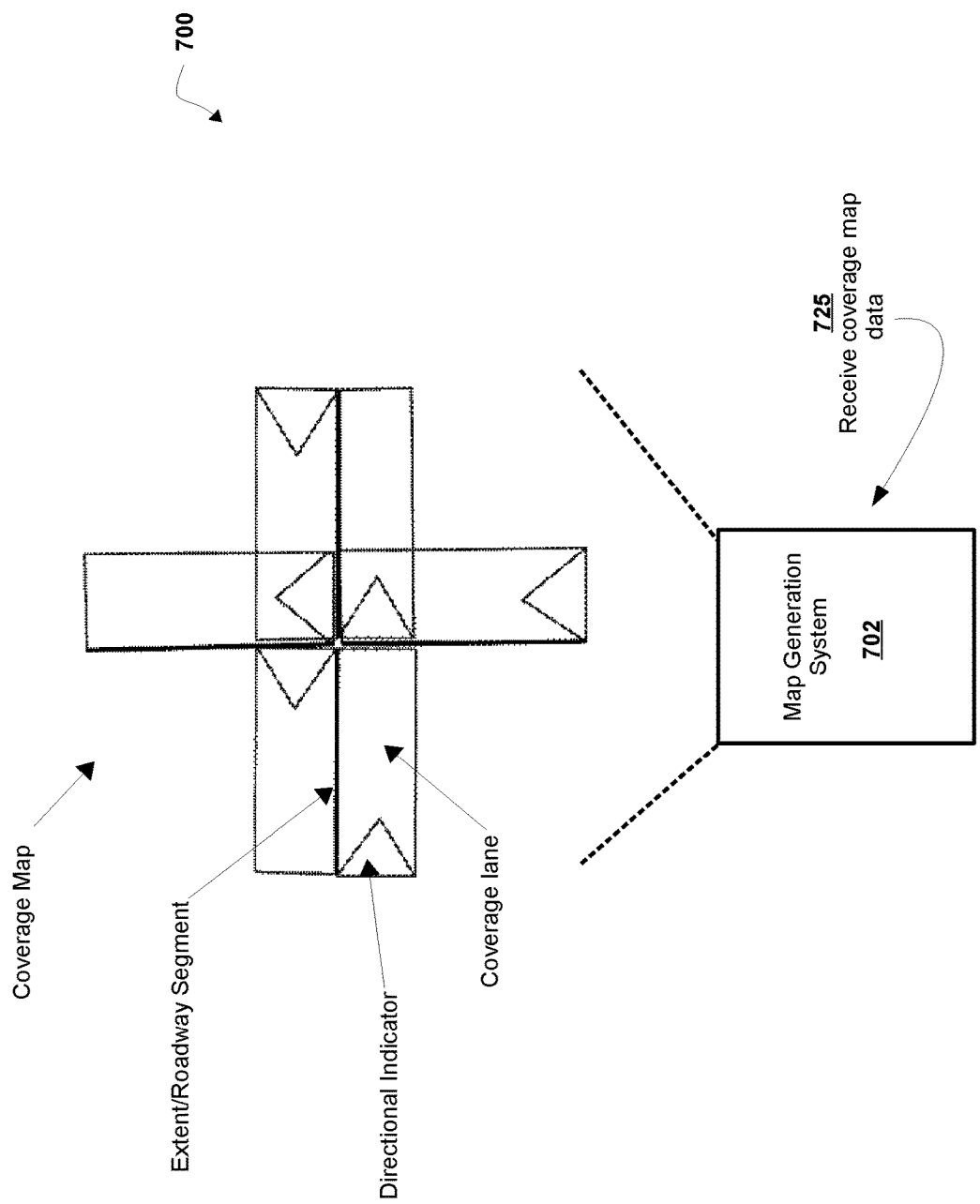
Figure 7C:
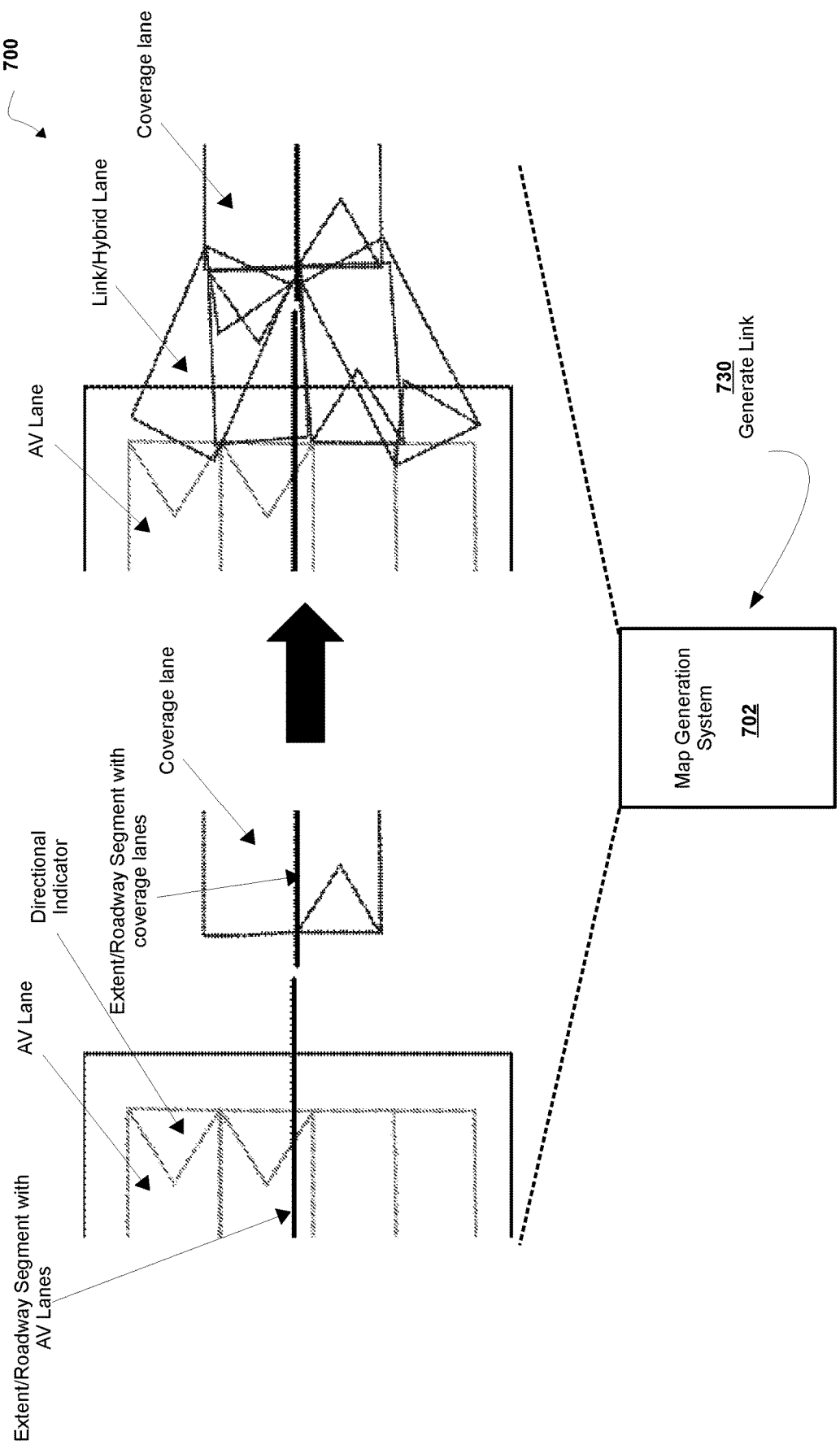

In some non-limiting embodiments, a roadway is associated with map data that defines one or more roadway segments or extents of the roadway. For example, a roadway segment or extent can be connected or linked to another roadway segment or extent to form a roadway network, or a roadway network can be divided into roadways segments or extents. In some non-limiting embodiments, a roadway segment or extent is associated with one or more lanes (e.g., one or more AV lanes, one or more coverage lanes, one or more hybrid lanes, etc.), and the one or more lanes are associated with a directional indicator indicating a direction of travel in the one or more lanes of the roadway segment or extent. As an example, FIGS. 7A-7C provide an example illustration roadway segments or extents associated with lanes including directional indicators.

In some non-limiting embodiments, a lane (and/or a roadway segment or extent) includes one or more ends. For example, an end of a lane (and/or a roadway segment or extent) is associated with or corresponds to a geographic location at which map data associated with the lane (and/or the roadway segment or extent) is unavailable. As an example, an end of an AV lane can correspond to a geographic location at which AV map data for that lane ends, for example, a geographic location at which the AV map data associated with the AV lane of a roadway segment extent transitions to coverage map data associated with a coverage lane of the roadway segment (or a geographic location at which less detailed AV map data or no AV map data for the roadway segment exists). In some non-limiting embodiments, for example, as shown in FIG. 7C, an arbitrary number of coverage lanes is represented by a single coverage lane. For example, as discussed herein, a coverage map may not include as high of a level of detail, e.g., as an AV map.

In some non-limiting embodiments, the map data includes a link (e.g., a logical link) that connects or links a lane (and/or a roadway segment or extent) to another lane (and/or to another roadway segment or extent). As an example, the map data includes a unique identifier for each lane (and/or roadway segment or extent), and the unique identifiers are associated with one another in the map data to indicate a connection or link of a lane to another lane (or a connection or link of a roadway segment or extent to another roadway segment or extent). For example, the unique identifiers can be associated with one another in the map data to indicate that a lane (and/or a roadway segment or extent) is a predecessor lane or a successor lane to another lane (and/or a predecessor or successor roadway segment or extent to another roadway segment or extent). As an example, a direction of travel of a predecessor lane to another lane is from the predecessor lane to the another lane, and a direction of travel of a successor lane to another lane is from the another lane to the successor lane. In some non-limiting embodiments, a distance between ends of an AV lane in an AV map linked to another AV lane in the AV map satisfies a threshold distance. For example, an end of an AV lane in an AV map can be linked to another lane in the AV map if the distance between the ends satisfies the threshold distance. As an example, the threshold distance to be satisfied for linking AV lanes in an AV map can be a shorter distance than a threshold distance to be satisfied for linking coverage lanes in a coverage map or linking an AV lane to a coverage lane in a hybrid map.

In some non-limiting embodiments, a map includes one or more AV lanes and/or one or more coverage lanes. In some non-limiting embodiments, a map includes one or more AV maps or submaps including one or more AV lanes and/or one or more coverage maps or submaps including one or more coverage lanes. In some non-limiting embodiments, AV map data is associated with an AV lane of a roadway in a geographic location, and coverage map data is associated with a coverage map of the geographic location. In some non-limiting embodiments, a map (e.g., a hybrid map) includes the AV lane linked with the coverage lane of the roadway in the geographic location.

In some non-limiting embodiments, the AV map data is associated with an AV lane of a roadway in the geographic location, and the coverage map data is associated with a coverage lane of the roadway in the geographic location. In some non-limiting embodiments, the AV map data is associated with an indication that the autonomous vehicle 104 can operate in the AV lane under a fully-autonomous mode, and the coverage map data is associated with an indication that the autonomous vehicle 104 can operate in the coverage lane under a partially-autonomous mode or a manual mode. For example, the AV map data is associated with an indication of whether autonomous vehicle 104 can be operated, routed, and/or travel in or under a fully-autonomous mode (e.g., be routed to travel fully-autonomously and/or travel fully-autonomously) in AV lanes, and the coverage map data is associated with an indication of whether autonomous vehicle 104 can be operated, routed, and/or travel in or under a partially-autonomous mode or a manual mode (e.g., be routed to travel partially-autonomously or manually and/or travel partially-autonomously or manually). As an example, the AV map includes a plurality of lanes, the plurality of lanes including the AV lane linked to another AV lane, and the AV map data is associated with an indication of whether autonomous vehicle 104 can operate under the fully-autonomous mode in the plurality of AV lanes. In some non-limiting embodiments, the coverage map data is associated with an indication that autonomous vehicle 104 cannot be operated, routed, and/or travel in or under the fully-autonomous mode in coverage lanes. As an example, the coverage map includes a plurality of lanes, the plurality of lanes including the coverage lane linked to another coverage lane, and the coverage map data is associated with an indication of whether autonomous vehicle 104 can operate under the partially-autonomous mode or the manual mode in the plurality of coverage lanes.

In some non-limiting embodiments, a lane in which autonomous vehicle 104 can operate under the fully-autonomous mode is associated with additional and/or alternative map data (e.g., additional or alternative attributes and/or roadway features) than another lane in which autonomous vehicle 104 cannot operate under the fully-autonomous mode. As an example, an AV lane in which autonomous vehicle 104 can operate under the fully-autonomous mode can be associated with AV map data including a more detailed and/or higher resolution map (e.g., a higher resolution point cloud), and a coverage lane in which autonomous vehicle 104 cannot operate under the fully-autonomous mode can be associated with coverage map data including a less detailed and/or lower resolution map (e.g., a lower resolution point cloud or no point cloud).

As further shown in FIG. 4, at step 404, process 400 includes generating a hybrid map of the geographic location based on the AV map data and the coverage map data. For example, map generation system 102 generates a hybrid map based on the AV map data and the coverage map data. In some non-limiting embodiments, the hybrid map includes the AV lane linked with the coverage lane of the roadway for routing an autonomous vehicle 104.

In some non-limiting embodiments, generating the hybrid map includes modifying the AV map to unlink the AV lane and another lane in the AV map based on the indication. For example, the map generation system 102 removes the another lane from the AV map based on an indication that autonomous vehicle 104 cannot be operated, routed, and/or travel in or under the fully-autonomous mode in the another lane. As an example, the map generation system 102 determines that the autonomous vehicle 104 cannot be operated, routed, and/or travel in or under the fully-autonomous mode in the another lane in the AV map based on the map data and/or user input. In some non-limiting embodiments, the map generation system 102 compares a distance between an end of the AV lane and an end of the another lane in the AV map to a threshold distance and removes the another lane from the AV map and/or unlinks the another lane from the AV lane in the AV map based on the comparison. For example, if a distance between an end of the AV lane in the AV map that is linked to the another lane in the AV map fails to satisfy a threshold distance, the map generation system 102 removes the another lane from the AV map and/or unlinks the another lane from the AV lane in the map.

Further details regarding step 404 of process 400 are provided below with regard to FIG. 5.

As further shown in FIG. 4, at step 406, process 400 includes providing hybrid map data associated with the hybrid map for routing of an autonomous vehicle 104. For example, map generation system 102 provides (e.g., transmits) hybrid map data associated with the hybrid map to autonomous vehicle 104.

Further details regarding step 406 of process 400 are provided below with regard to FIG. 6.

Figure 5:
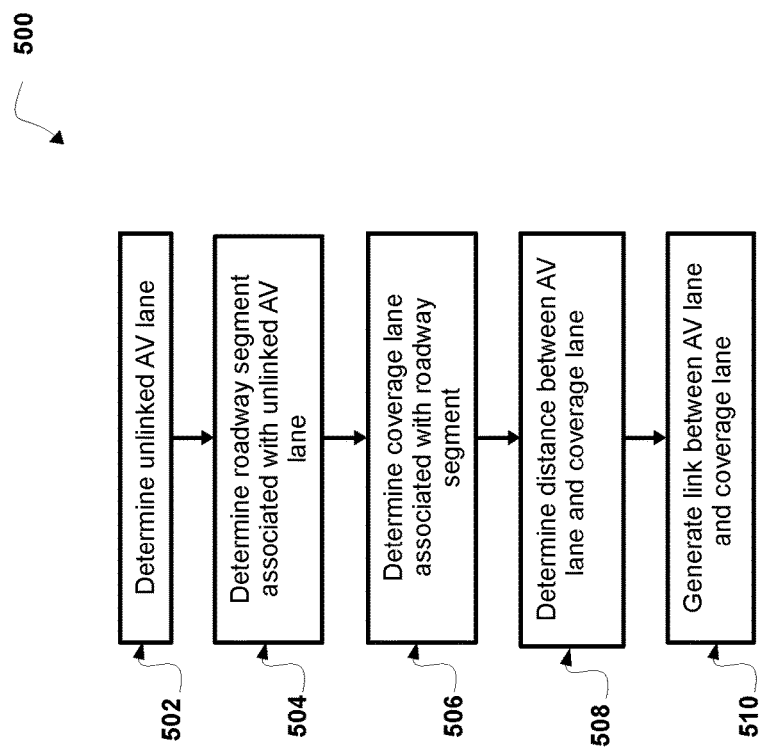
FIG. 5 is a flowchart of a non-limiting embodiment of a process for generating a hybrid map.

Referring now to FIG. 5, FIG. 5 is a flowchart of a non-limiting embodiment of a process 500 for generating a hybrid map. In some non-limiting embodiments, one or more of the steps of process 500 are performed (e.g., completely, partially, etc.) by map generation system 102 (e.g., one or more devices of map generation system 102). In some non-limiting embodiments, one or more of the steps of process 500 are performed (e.g., completely, partially, etc.) by another device or a group of devices separate from or including map generation system 102, such as autonomous vehicle 104 (e.g., one or more devices of autonomous vehicle 104).

As shown in FIG. 5, at step 502, process 500 includes determining an end of the AV lane that is not linked to another AV lane in the AV map based on the AV map data. For example, map generation system 102 determines an end of the AV lane that is not linked to another AV lane in the AV map based on the AV map data. In some non-limiting embodiments, map generation system 102 analyzes the unique identifier of the AV lane in the AV map data for an association with a unique identifier of another AV lane in the map data that indicates another AV lane is a predecessor lane or a successor lane to the AV lane. For example, if the map generation system 102 determines that the AV lane is not associated with a predecessor lane and/or a successor lane, the map generation system determines that an end(s) of the AV lane is not linked to another AV lane in the AV map. As an example, an end of the AV lane in a first direction corresponding to the directional indicator of the AV lane is determined as not linked to another AV lane if the unique identifier of the AV lane is not associated with a unique identifier indicating a successor lane, and another end of the AV lane in a direction opposite the first direction corresponding to the directional indicator of the AV lane is determined as not linked to another AV lane if the unique identifier of the AV lane is not associated with a unique identifier indicating a predecessor lane.

In some non-limiting embodiments, map generation system 102 can analyze each AV lane of the AV map (or a subset of AV lanes of the AV map) for an end of that AV lane that is not linked to another AV lane in the AV map based on the map data and generate links to coverage lanes for unlinked ends of unlinked AV lanes as described herein. In some non-limiting embodiments, map generation system 102 can determine the subset of AV lanes of the AV map to analyze for unlinked ends based on one or more attributes of the AV lanes, user input, and/or the like.

As further shown in FIG. 5, at step 504, process 500 includes determining a roadway segment of the roadway associated with the AV lane based on the AV map data. For example, map generation system 102 determines a roadway segment or extent of the roadway associated with the unlinked AV lane based on the AV map data. In some non-limiting embodiments, map generation system 102 determines a unique identifier of the roadway segment or extent of the roadway associated with the unlinked AV lane based on the AV map data, and the map generation system 102 identifies that roadway segment or extent in the coverage map based on the unique identifier.

As further shown in FIG. 5, at step 506, process 500 includes determining the coverage lane in the coverage map based on the roadway segment and the coverage map data. For example, map generation system 102 determines the coverage lane in the coverage map based on the roadway segment or extent determined to be associated with the unlinked AV lane and the coverage map data. In some non-limiting embodiments, map generation system 102 determines a coverage lane associated with the roadway segment or extent at or nearest to the unlinked end of the unlinked AV lane and including a directional indicator indicating the same direction of travel as the unlinked AV lane. For example, map generation system 102 identifies the roadway segment or extent in the coverage map with the same unique identifier as (e.g., closest in geographic location to) the roadway segment or extent determined to be associated with the unlinked AV lane, and determines a coverage lane associated with that roadway segment or extent in the coverage map, which is at or nearest to the unlinked end of the unlinked AV lane with respect to the roadway segment or extent, and which is associated with a directional identifier indicating the same direction of travel as the unlinked AV lane.

As further shown in FIG. 5, at step 508, process 500 includes determining a distance between the end of the AV lane and an end of the coverage lane based on the AV map data and the coverage map data. For example, map generation system 102 determines a distance between the unlinked end of the unlinked AV lane and an end of the coverage lane based on the AV map data and the coverage map data. In some non-limiting embodiments, map generation system 102 determines a distance between a geographic location of the unlinked end of the unlinked AV lane with respect to the determined roadway segment or extent and a geographic location of the end of the coverage lane at or nearest to the unlinked end of the AV lane. For example, if the determined coverage lane overlaps with the unlinked AV lane with respect to the roadway segment or extent (e.g., the unlinked end of the unlinked AV lane is located within the determined coverage lane with respect to the roadway segment or extent), the distance between the unlinked AV lane and the determined coverage lane is determined as zero and/or overlapping. As an example, if the determined coverage lane is spaced from the unlinked AV lane with respect to the roadway segment or extent (e.g., the unlinked end of the unlinked AV lane is spaced from the end of the determined coverage lane at or nearest to the unlinked end of the unlinked AV lane), the distance between the unlinked AV lane and the determined coverage lane is the distance between the unlinked end of the AV lane and the end of the determined coverage lane at or nearest to the unlinked end of the AV lane, which can be determined based on the AV map data and/or the coverage map data indicating geographic locations of the ends of the lanes and/or roadway segments or extents.

As further shown in FIG. 5, at step 510, process 500 includes generating a link between the AV lane and the coverage lane to be included in the hybrid map. For example, map generation system 102 generates a link between the unlinked AV lane and the coverage lane to be included in the hybrid map. In some non-limiting embodiments, if the distance between the unlinked end of the unlinked AV lane and the end of the determined coverage lane at or nearest to the unlinked end of the AV lane satisfies a threshold distance (e.g., is less than a threshold distance, etc.), map generation system 102 generates the link between the unlinked AV lane and the coverage lane to be included in the hybrid map by associating the unique identifier of the AV lane with the unique identifier of the coverage lane, for example, in the hybrid map data associated with the hybrid map. For example, the map generation system 102 can associate the unique identifier of the coverage lane as a predecessor lane to the unlinked AV lane or as a successor lane to the unlinked AV lane (e.g., as a logical link indicating a predecessor or a successor lane) based on the geographic location of the lanes and the directional indicators of the lanes.

In some non-limiting embodiments, generating the link includes generating a hybrid lane between the unlinked AV lane and the coverage lane. In some non-limiting embodiments, a hybrid lane can be associated with coverage map data and may be represented by and/or include a coverage lane for operating, routing, and/or traveling functions of autonomous vehicle 104. For example, map generation system 102 generates a hybrid lane (e.g., coverage lane) between the unlinked AV lane and the coverage lane to be included in the hybrid map. As an example, the route includes the unlinked AV lane linked to the hybrid lane and the hybrid lane linked to the coverage lane. In some non-limiting embodiments, if the distance between the unlinked end of the unlinked AV lane and the end of the determined coverage lane at or nearest to the unlinked end of the unlinked AV lane does not satisfy the threshold distance (e.g., is greater than the threshold distance, etc.), generating the link includes generating the hybrid lane between the unlinked end of the unlinked AV lane and the end of the determined coverage lane at or nearest to the unlinked end of the AV lane to be included in the hybrid map. For example, the hybrid lane includes a first end linking the unlinked end of the unlinked AV lane and a second end linking the end of the coverage lane. As an example, map generation system 102 generates a unique identifier for the hybrid lane, associates the unique identifier of the unlinked AV lane as a predecessor or successor lane to the hybrid lane in the hybrid map data, and associates the unique identifier of the determined coverage lane as the other of the predecessor or successor lane to the hybrid lane in the hybrid map data. In some non-limiting embodiments, the hybrid map data is associated with an indication that the autonomous vehicle 104 can operate in the hybrid lane under the partially-autonomous mode or the manual mode. For example, map generation system 102 generates hybrid map data associated with the hybrid lane based on the AV map data and the coverage map data. As an example, map generation system 102 determines, based on the AV map data and the coverage map data, hybrid map data associated with one or more attributes of the hybrid lane, such as, a directional indicator of the hybrid lane, connections or links of the hybrid lane to the AV lane and the coverage lane, an association of the hybrid lane with one or more roadway segments or extents that connect the AV lane and the coverage lane, and/or the like. In some non-limiting embodiments, map generation system 102 extrapolates the AV map data of the unlinked AV lane and the coverage map data of the determined coverage lane to estimate one or more attributes of the hybrid lane between the unlinked AV lane and the determined coverage lane. For example, one or more attributes of the hybrid lane (e.g., lane dimensions of the hybrid lane, etc.) between the unlinked AV lane and the determined coverage lane can be estimated to fit the hybrid lane between the unlinked AV lane and the determined coverage lane in the hybrid map (e.g., to fit dimensions of the hybrid lane to the dimensions of the unlinked AV lane and the determined coverage lane, etc.).

Figure 6:
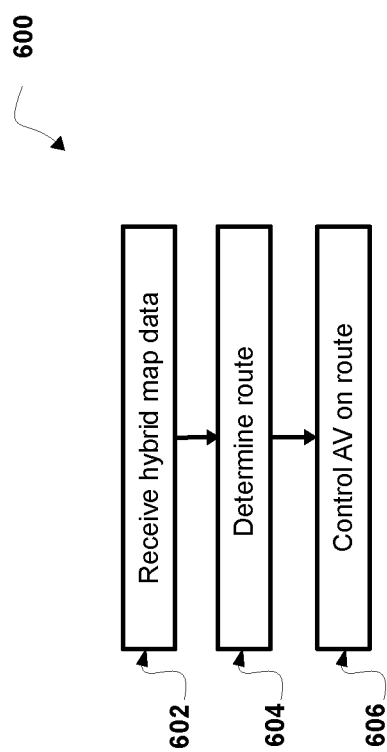
FIG. 6 is a flowchart of a non-limiting embodiment of a process for determining a route in a hybrid map.

Referring now to FIG. 6, FIG. 6 is a flowchart of a non-limiting embodiment of a process 600 for generating a hybrid map. In some non-limiting embodiments, one or more of the steps of process 600 are performed (e.g., completely, partially, etc.) by autonomous vehicle 104 (e.g., one or more devices of autonomous vehicle 104). In some non-limiting embodiments, one or more of the steps of process 600 are performed (e.g., completely, partially, etc.) by another device or a group of devices separate from or including autonomous vehicle 104, such as map generation system 102 (e.g., one or more devices of map generation system 102).

As shown in FIG. 6, at step 602, process 600 includes receiving hybrid map data associated with a hybrid map of a geographic location. For example, autonomous vehicle 104 (e.g., vehicle computing system 202, etc.) receives hybrid map data associated with a hybrid map of a geographic location from map generation system 102. In some non-limiting embodiments, the hybrid map includes an AV lane linked with a coverage lane of a roadway in the geographic location, and the hybrid map data is associated with an indication that the autonomous vehicle 104 can operate under a fully-autonomous mode in the AV lane on the roadway and an indication that the autonomous vehicle 104 can operate under a partially-autonomous mode or a manual mode in the coverage lane.

As further shown in FIG. 6, at step 604, process 600 includes determining a route including the AV lane linked with the coverage lane of the roadway in the geographic location based on the hybrid map data. For example, autonomous vehicle 104 (e.g., vehicle computing system 202, etc.) determines a route including the AV lane linked with the coverage lane of the roadway in the geographic location based on the hybrid map data. In some non-limiting embodiments, vehicle computing system 202 receives a request for service, and the request for service is associated with request data associated with a pick-up location (or a current location) and a drop-off location in the geographic location, and vehicle computing system 202 determines a route between the pick-up location (or the current location) and the drop-off location in the geographic location that includes the AV lane linked with the coverage lane based on the hybrid map data.

As further shown in FIG. 6, at step 606, process 600 includes controlling the AV on the route based on the hybrid map data. For example, autonomous vehicle 104 (e.g., vehicle computing system 202, etc.) controls autonomous vehicle 104 on the route based on the hybrid map data. As an example, vehicle computing system 202 controls autonomous vehicle 104 to operate under the fully-autonomous mode, the partially-autonomous mode, and/or the manual mode on the route based on the hybrid map data, and vehicle computing system 202 controls travel and one or more functionalities associated with the fully-autonomous mode of autonomous vehicle 104 on the route when autonomous vehicle 104 is operating under the fully-autonomous mode on the route and, in some non-limiting embodiments, controls one or more functionalities associated with the partially-autonomous mode or the manual mode of autonomous vehicle 104 when autonomous vehicle 104 is operating under the partially-autonomous mode or the manual mode on the route.

In some non-limiting embodiments, autonomous vehicle 104 includes sensors 206 for detecting an object in an environment surrounding the AV as described herein, and vehicle computing system 202 controls travel of autonomous vehicle 104 on at least a portion of the route based on sensor data from sensors 206 and the hybrid map data associated with the hybrid map. For example, vehicle computing system 202 controls one or more vehicle controls 226 (e.g., a device that controls acceleration, a device that controls steering, a device that controls braking, an actuator that controls gas flow, etc.) of autonomous vehicle 104 based on the sensor data and the hybrid map data to control travel of the autonomous vehicle 104 on the route under the fully-autonomous mode.

In some non-limiting embodiments, autonomous vehicle 104 includes positioning system 204 for determining a position of autonomous vehicle 104 as described herein, and vehicle computing system 202 controls autonomous vehicle 104 to operate under the fully-autonomous mode on the at least a portion of the route and controls autonomous vehicle 104 to operate under the partially-autonomous mode or the manual mode on at least another portion of the route based on positioning data from positioning system 204 and the hybrid map data associated with the hybrid map. For example, vehicle computing system 202 determines a position of autonomous vehicle 104 in the AV lane or the coverage lane (e.g., the hybrid lane), and controls autonomous vehicle 104 to operate based on the location of autonomous vehicle 104 (e.g., based on a type of lane in which autonomous vehicle 104 is located, based on a location of autonomous vehicle 104 with respect to an end of the lane in which autonomous vehicle 104 is located, based on a type of predecessor lane and/or successor lane of the lane in which autonomous vehicle 104 is located, etc.) As an example, vehicle computing system 202 controls one or more vehicle controls 226 (e.g., a device that controls acceleration, a device that controls steering, a device that controls braking, an actuator that controls gas flow, etc.) of autonomous vehicle 104 based on the positioning data and the hybrid map data to operate the autonomous vehicle 104 in or under the fully-autonomous mode in the AV lane, and vehicle computing system 202 controls one or more functionalities associated with the partially-autonomous mode or the manual mode of autonomous vehicle 104 based on the positioning data and the hybrid map data to operate the autonomous vehicle 104 in or under the partially-autonomous mode or the manual mode in the coverage lane (or the hybrid lane).

In some non-limiting embodiments, vehicle computing system 202 determines, based on the positioning data from the positioning system and the hybrid map data, that autonomous vehicle 104 is operating under the fully-autonomous mode in the AV lane on the route including the AV lane linked to the coverage lane, and vehicle computing system 202 controls autonomous vehicle 104 to switch from operating under the fully-autonomous mode to operating under the partially-autonomous mode or the manual mode in the AV lane based on determining that autonomous vehicle 104 is operating under the fully-autonomous mode in the AV lane. For example, vehicle computing system 202 can determine based on the positioning data and the hybrid map data that autonomous vehicle 104 is about to enter the coverage lane (or the hybrid lane) from the AV lane (e.g., that autonomous vehicle 104 is traveling on the AV lane in a direction toward a successor lane (e.g., the coverage lane or the hybrid lane) and is within a threshold distance of a location of the connection or link between the AV lane and the successor lane. As an example, vehicle computing system 202 can control autonomous vehicle 104 to switch or begin the transition from operating under the fully-autonomous mode to operating under the partially-autonomous mode or the manual mode in the AV lane before autonomous vehicle 104 enters the coverage lane (or the hybrid lane).

Referring now to FIGS. 7A-7E, FIGS. 7A-7E are diagrams of an overview of a non-limiting embodiment of an implementation 700 relating to a process for generating a hybrid map. As shown in FIGS. 7A-7E, implementation 700 may include map generation system 702, autonomous vehicle 704, vehicle computing system 712, and vehicle controls 718. In some non-limiting embodiments, map generation system 702 may be the same or similar to map generation system 102. In some non-limiting embodiments, autonomous vehicle 704 may be the same or similar to autonomous vehicle 104. In some non-limiting embodiments, vehicle computing system 712 may be the same or similar to vehicle computing system 202. In some non-limiting embodiments, vehicle controls 718 may be the same or similar to vehicle controls 226.

As shown by reference number 720 in FIG. 7A, map generation system 702 receives AV map data associated with an AV map of a geographic location. For example, map generation system 702 can retrieve (e.g., obtain) the AV map data from one or more databases. In some non-limiting embodiments, the AV map data is associated with one or more AV lanes of one or more roadway segments or extents in the geographic location. As an example, FIG. 7A shows example AV lanes associated with example roadway segments or extents in an example AV map. In some non-limiting embodiments, an end of an AV lane is not linked to another AV lane in the AV map.

As shown by reference number 725 in FIG. 7B, map generation system 702 receives coverage map data associated with a coverage map of a geographic location. For example, map generation system 702 can retrieve (e.g., obtain) the coverage map data from one or more databases. In some non-limiting embodiments, the coverage map data is associated with one or more coverage lanes of one or more roadway segments or extents in the geographic location. As an example, FIG. 7B shows example coverage lanes associated with example roadway segments or extents in an example coverage map. In some non-limiting embodiments, a coverage lane is associated with the same roadway segment or extent as the unlinked AV lane or associated with a roadway segment or extent within a threshold distance of the roadway segment or extent associated with the unlinked end of the AV lane.

As shown by reference number 730 in FIG. 7C, map generation system 702 generates a link between the AV lane and the coverage lane to be included in a hybrid map. In some non-limiting embodiments, map generation system 702 generates the link by generating a hybrid lane between the AV lane and the coverage lane. For example, map generation system 702 generates a hybrid lane between the unlinked AV lane and the coverage lane associated with the roadway segment or extent at or nearest to the unlinked end of the AV lane. For example, the hybrid lane includes a first end linking the end of the AV lane and a second end linking the end of the coverage lane. As an example, map generation system 702 generates a unique identifier for the hybrid lane, associates the unique identifier of the unlinked AV lane as a predecessor or successor lane to the hybrid lane in the hybrid map data, and associates the unique identifier of the determined coverage lane as the other of the predecessor or successor lane to the hybrid lane in the hybrid map data.

Figure 7D:
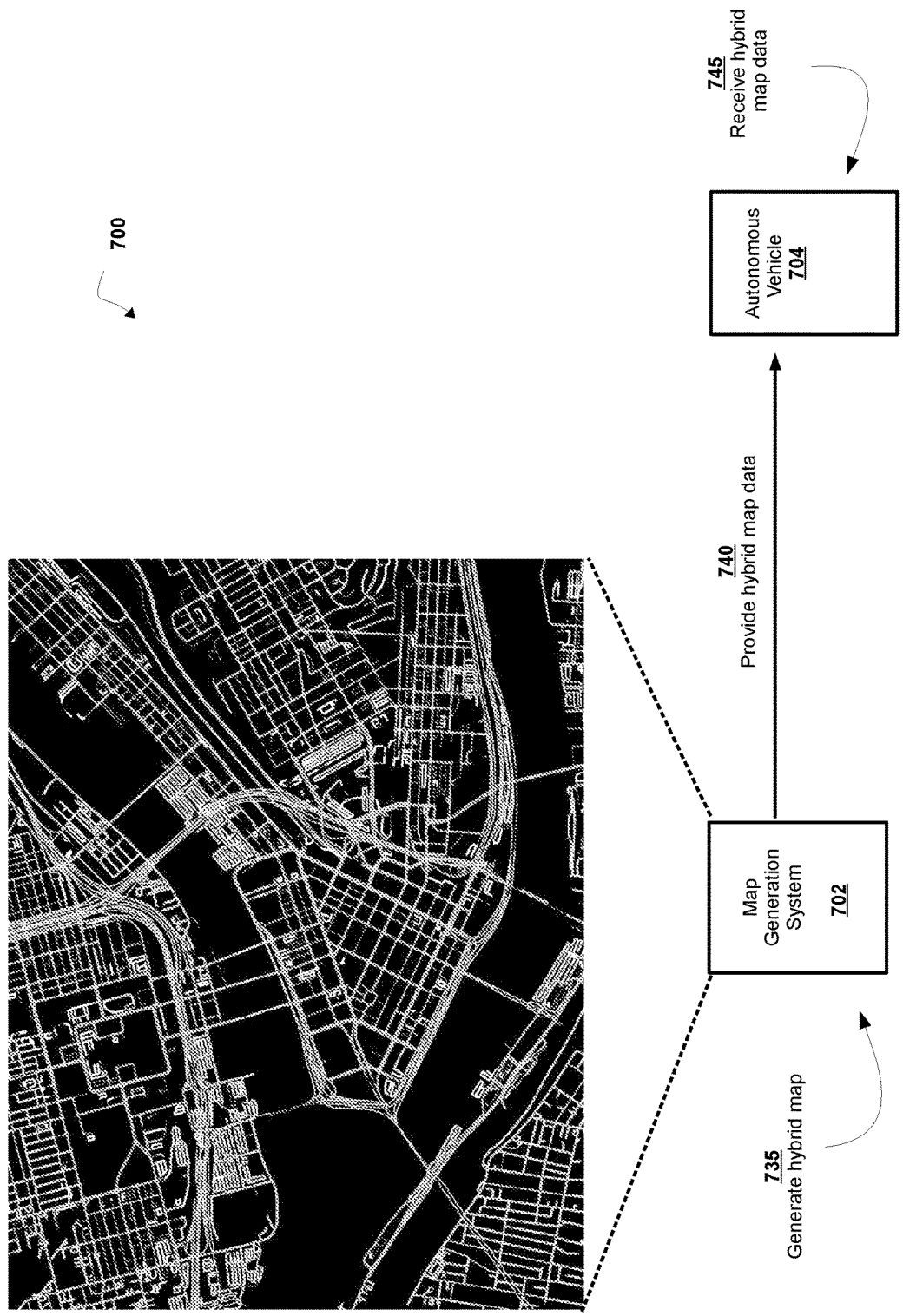

As shown by reference number 735 in FIG. 7D, map generation system 702 generates the hybrid map of the geographic location based on the AV map data and the coverage map data. For example, the hybrid map includes the AV lane linked with the coverage lane of the roadway by the hybrid lane for routing an autonomous vehicle 104. As an example, map generation system 702 generates hybrid map data associated with the hybrid lane based on the AV map data and the coverage map data.

As shown by reference number 740 in FIG. 7D, map generation system 702 provides hybrid map data associated with the hybrid map for routing of an autonomous vehicle 104. For example, map generation system 702 transmits the hybrid map data to autonomous vehicle 704. In some non-limiting embodiments, map generation system 702 can generate and transmit a complete hybrid map to autonomous vehicle 704, which enables autonomous vehicle 704 to use the hybrid map in a read-only manner (e.g., autonomous vehicle 704 may not need to spend time and processing resources generating the hybrid map or portions thereof).

As shown by reference number 745 in FIG. 7D, autonomous vehicle 704 receives the hybrid map data. For example, autonomous vehicle 704 receives the hybrid map data from map generation system 702.

Figure 7E:
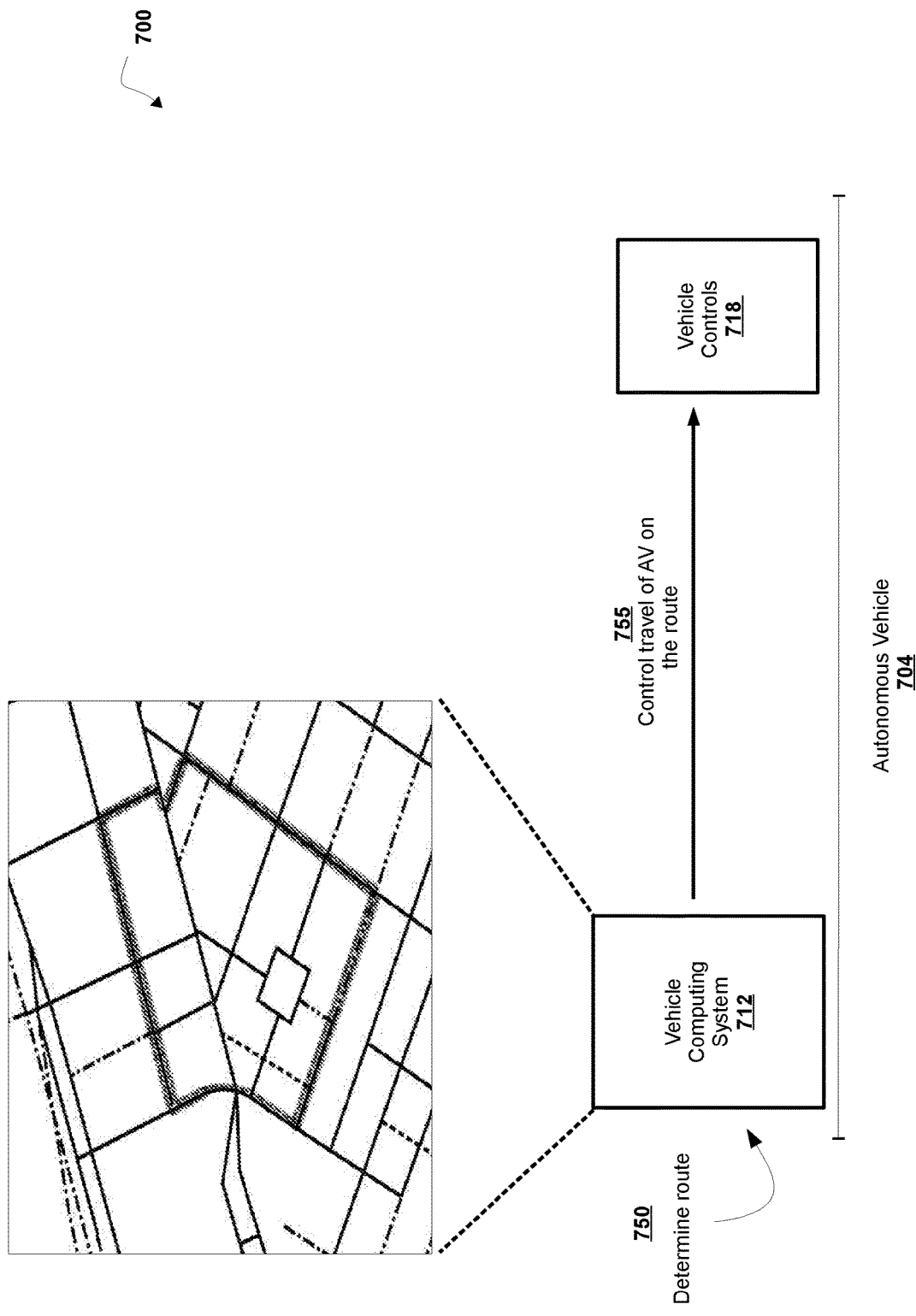

As shown by reference number 750 in FIG. 7E, vehicle computing system 712 of autonomous vehicle 704 determines a route including the AV lane linked with the coverage lane of the roadway in the geographic location based on the hybrid map data. For example, vehicle computing system 712 determines a route between a pick-up location (or a current location) and a drop-off location in the geographic location that includes the AV lane linked with the coverage lane based on the hybrid map data.

In some non-limiting embodiments, the hybrid map enables vehicle computing system 712 to use additional and/or alternative routes for routing autonomous vehicle 704 other than routes that are available for routing from the AV map, and vehicle computing system 712 can perform all routing (e.g., routing for travel under fully-autonomous mode, partially-autonomous mode, manual mode, etc.) at autonomous vehicle 704 without some or all of the routing for autonomous vehicle 704 being performed at map generation system 702 or another remote system. For example, the hybrid map enables vehicle computing system 712 to autonomously determine a route between the pick-up location (or the current location) and the drop-off location in the geographic location that includes the AV lane linked with the coverage lane based on the hybrid map data, without requiring routing to be performed at map generation system 702 or another remote system to route autonomous vehicle 704 for travel in or under the partially-autonomous mode or the manual mode on a route that also includes travel in or under the fully-autonomous mode.

As shown by reference number 755 in FIG. 7E, vehicle computing system 712 controls operation and/or travel of autonomous vehicle 704 on the route based on the hybrid map data. For example, vehicle computing system 712 controls autonomous vehicle 704 to operate under the fully-autonomous mode, the partially-autonomous mode, and/or the manual mode on the route based on the hybrid map data. As an example, vehicle computing system 712 controls travel and one or more functionalities associated with the fully-autonomous mode of autonomous vehicle 704 on the route when autonomous vehicle 704 is operating under the fully-autonomous mode on the route, for example, by controlling one or more vehicle controls 718 (e.g., a device that controls acceleration, a device that controls steering, a device that controls braking, an actuator that controls gas flow, etc.) of autonomous vehicle 704 based on sensor data, position data, and/or the hybrid map data. In some non-limiting embodiments, vehicle computing system 712 controls one or more functionalities associated with the partially-autonomous mode or the manual mode of autonomous vehicle 704 when autonomous vehicle 704 is operating under the partially-autonomous mode or the manual mode on the route.

The foregoing disclosure provides illustration and description, but is not intended to be exhaustive or to limit the implementations to the precise form disclosed. Modifications and variations are possible in light of the above disclosure or may be acquired from practice of the implementations.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, etc.

It will be apparent that systems and/or methods, described herein, can be implemented in different forms of hardware, software, or a combination of hardware and software. The actual specialized control hardware or software code used to implement these systems and/or methods is not limiting of the implementations. Thus, the operation and behavior of the systems and/or methods are described herein without reference to specific software code, it being understood that software and hardware can be designed to implement the systems and/or methods based on the description herein.

Even though particular combinations of features are recited in the claims and/or disclosed in the specification, these combinations are not intended to limit the disclosure of possible implementations. In fact, many of these features can be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," and/or the like are intended to be open-ended terms. Further, the phrase "based on" is intended to mean "based, at least in part, on" unless explicitly stated otherwise.

What is claimed is:

1. A method comprising:
   obtaining, with a computer system comprising one or more processors, first map data for a geographic area, the first map data describing a plurality of first map lanes in the geographic area, wherein an autonomous vehicle (AV) is operated in a first autonomous mode in the plurality of first map lanes;
   obtaining, with the computer system, second map data for the geographic area, the second map data describing a plurality of second map lanes in the geographic area, wherein the AV is operated in a second mode in the plurality of second map lanes, the second mode being different than the first autonomous mode;
   generating, by the computer system, hybrid map data describing the geographic area, the generating of the hybrid map comprising linking a first lane of the plurality of first map lanes to a second lane of the plurality of second map lanes; and
   providing, by the computer system, the hybrid map data to an AV control system for the AV for controlling travel of the AV.

2. The method of claim 1, further comprising:
   generating, by the computer system, a route for the AV using the hybrid map data; and
   providing, by the computer system, the route to an AV control system for the AV for controlling travel of the AV along the route.

3. The method of claim 2, further comprising generating a hybrid lane between the first lane and the second lane, the route comprising the first lane linked to the hybrid lane and the hybrid lane linked to the second lane.

4. The method of claim 1, further comprising determining an end of the first lane that is not linked to another lane of the plurality of first map lanes.

5. The method of claim 4, further comprising:
   determining a distance between the end of the first lane and an end of the second lane; and
   generating a hybrid lane between the end of the first lane and the end of the second lane, the hybrid lane comprising:
   a first end linking the end of the first lane; and
   a second end linking the end of the second lane, the hybrid map data describing the first lane, the second lane, and the hybrid lane.

6. The method of claim 1, the first map data comprising the first lane linked to a third lane from the plurality of first map lanes, further comprising:
   determining that the AV is not operated in the first autonomous mode while in the third lane; and unlinking the first lane and the third lane.

7. The method of claim 1, further comprising determining, using at least one of the first map data or the second map data, that there is more than a threshold distance between the first lane and a next lane from the plurality of first map lanes in which the AV is operated in the first autonomous mode.

8. The method of claim 1, the first map data comprising an indication that the AV is operated in the first lane under the first autonomous mode, and the second map data comprising an indication that the AV is operated in a manual mode or in the second lane under a second autonomous mode different than the first autonomous mode.

9. The method of claim 1, wherein the first map data comprises data captured by at least one AV during travel in the geographic area.

10. A computing system comprising:
one or more processors configured to perform operations comprising:
obtaining first map data for a geographic area, the first map data describing a plurality of first map lanes in the geographic area, wherein an autonomous vehicle (AV) is operated in a first autonomous mode in the plurality of first map lanes;
obtaining second map data for the geographic area, the second map data describing a plurality of second map lanes in the geographic area, wherein the AV is operated in a second mode in the plurality of second map lanes, the second mode being different than the first autonomous mode;
generating hybrid map data describing the geographic area, the generating of the hybrid map comprising linking a first lane of the plurality of first map lanes to a second lane of the plurality of second map lanes; and
providing the hybrid map data to an AV control system for the AV for controlling travel of the AV.

11. The computing system of claim 10, the operations further comprising:
generating a route for the AV using the hybrid map data; and
providing the route to an AV control system for the AV for controlling travel of the AV along the route.

12. The computing system of claim 11, the operations further comprising generating a hybrid lane between the first lane and the second lane, the route comprising the first lane linked to the hybrid lane and the hybrid lane linked to the second lane.

13. The computing system of claim 10, the operations further comprising determining an end of the first lane that is not linked to another lane of the plurality of first map lanes.

14. The computing system of claim 13, the operations further comprising:
determining a distance between the end of the first lane and an end of the second lane; and
generating a hybrid lane between the end of the first lane and the end of the second lane, the hybrid lane comprising:

a first end linking the end of the first lane; and
a second end linking the end of the second lane, the hybrid map data describing the first lane, the second lane, and the hybrid lane.

15. The computing system of claim 10, the first map data comprising the first lane linked to a third lane from the plurality of first map lanes, the operations further comprising:
determining that the AV is not operated in the first autonomous mode while in the third lane; and
unlinking the first lane and the third lane.

16. The computing system of claim 10, the operations further comprising determining, using at least one of the first map data or the second map data, that there is more than a threshold distance between the first lane and a next lane from the plurality of first map lanes in which the AV is operated in the first autonomous mode.

17. The computing system of claim 10, the first map data comprising an indication that the AV is operated in the first lane under the first autonomous mode, and the second map data comprising an indication that the AV is operated in a manual mode or in the second lane under a second autonomous mode different than the first autonomous mode.

18. The computing system of claim 10, wherein the first map data comprises data captured by at least one AV during travel in the geographic area.

19. A method comprising:
obtaining, with a computer system comprising one or more processors, first map data for a geographic area, the first map data describing a plurality of first map lanes in the geographic area, wherein an autonomous vehicle (AV) is operated in a first autonomous mode in the plurality of first map lanes;
obtaining, with the computer system, second map data for the geographic area, the second map data describing a plurality of second map lanes in the geographic area, wherein the AV is operated in a second mode in the plurality of second map lanes, the second mode being different than the first autonomous mode;
generating, by the computer system, hybrid map data describing the geographic area, the hybrid map data comprising a first lane from the plurality of first map lanes, wherein the first lane is linked to a second lane from the plurality of second map lanes;
generating, by the computer system, a route for the AV using the hybrid map data; and
providing, by the computer system, the route to an AV control system for the AV for controlling travel of the AV along the route.

20. The method of claim 19, further comprising generating a hybrid lane between the first lane and the second lane, the route comprising the first lane linked to the hybrid lane and the hybrid lane linked to the second lane.

* * * * *